US007215122B2

(12) United States Patent
Zhao et al.

(10) Patent No.: US 7,215,122 B2
(45) Date of Patent: May 8, 2007

(54) PHANTOM FOR PRODUCTION OF CONTROLLABLE FMRI SIGNAL

(75) Inventors: Qun Zhao, Gainesville, FL (US); G. Randy Duensing, Gainesville, FL (US); Hu Cheng, Gainesville, FL (US); William A. Edelstein, Schenectady, NY (US)

(73) Assignee: Invivo Corporation, Gainsville, FL (US)

(*) Notice: Subject to any disclaimer, the term of this patent is extended or adjusted under 35 U.S.C. 154(b) by 74 days.

(21) Appl. No.: 10/957,822

(22) Filed: Oct. 4, 2004

(65) Prior Publication Data
US 2005/0110490 A1 May 26, 2005

Related U.S. Application Data

(60) Provisional application No. 60/508,570, filed on Oct. 3, 2003.

(51) Int. Cl.
*G01V 3/00* (2006.01)
(52) U.S. Cl. ...................... 324/318; 324/311
(58) Field of Classification Search ............... 324/318, 324/311, 308, 322
See application file for complete search history.

(56) References Cited

U.S. PATENT DOCUMENTS

| 4,725,779 | A | * | 2/1988 | Hyde et al. | 324/318 |
| 5,278,505 | A | * | 1/1994 | Arakawa | 324/322 |
| 6,747,452 | B1 | * | 6/2004 | Jectic et al. | 324/311 |

OTHER PUBLICATIONS

Bodurka, J. et al. "Analysis of Physical Mechanisms of Respiration-Induced fMRI Signal Changes" *Proc. Intl. Soc. Mag. Reson. Med.*, 2000, p. 1006, vol. 8, XP-002313168.

Bodurka, J. et al. "Current-Induced Magnetic Resonance Phase Imaging" *Journal of Magnetic Resonance*, 1999, pp. 265-271, vol. 137.
Brosch, J. R. et al. "Simulation of Human Respiration in fMRI With a Mechanical Model" *IEEE Transactions on Biomedical Engineering*, Jul. 7, 2002, pp. 700-706, vol. 49, No. 7.
Cheng, H. et al. "A fMRI Study of the SMARTPHANTOM" *Proc. Intl. Soc. Mag. Reson. Med.*, 2004, p. 1041, vol. 11.
Constable, R. T. et al. "Quantifying and Comparing Region-of-Interest Activation Patterns in Functional Brain MR Imaging: Methodolgy Considerations" *Magnetic Resonance Imaging*, 1998, pp. 289-300, vol. 16, No. 3.
Desco, M. et al. "Multiresolution Analysis in fMRI: Sensitivity and Specificity in the Detection of Brain Activation" *Human Brain Mapping*, 2001, pp. 16-27, vol. 14.
Dymond, R. C. et al. "A Novel T2* Phantom for Testing of fMRI Techniques" *Proceedings of the International Society for Magnetic Resonance in Medicine*, Apr. 1998, p. 1505, XP002313169.

(Continued)

*Primary Examiner*—Louis M Arana
(74) *Attorney, Agent, or Firm*—Saliwanchik, Lloyd & Saliwanchik

(57) ABSTRACT

The subject invention relates to a method and apparatus for producing stimulated MRI data. In an embodiment, a remote-controlled "smart phantom" can produce simulated data. The simulated data can be acquired from a MRI system. The subject device can generate control signals and send the generated control signals to secondary coils/probes placed in the subject smart phantom. The control signals determine the current flow in the secondary coils/probes, which act as local spin magnetization amplifiers and thus produce regions of variable contrast to noise ratio. The control signals can be generated with various parameters, such as BOLD models, different levels of contrast-to-noise ratio (CNR), signal intensities, and physiological signals. Comparisons can be made with the widely-used simulated data by computers. Validation of the subject smart phantom can be performed with both theoretical analysis and data of human subjects.

95 Claims, 16 Drawing Sheets

OTHER PUBLICATIONS

Frank et al. "Probabilistic analysis of fMRI data" *Magnetic resonance in medicine*, 1998, pp. 132-148, vol. 39.

Friston et al. "Statistical parametric maps in functional imaging: A general linear approach" *Human Brain Mapping*, 1995, pp. 189-210, vol. 2.

Gold, S. et al. "Functional MRI Statistical Software Packages: A Comparative Analysis" *Human Brain Mapping*, 1998, pp. 73-84, vol. 6.

Joensuu, R. et al. "fMRI Phantom for an MR Imager" *Proc. 10th Annual Human Brain Mapping*, Jun. 2004, abstract only.

Koopmans, P. et al. "Development of a reference phantom for fMRI studies" *Proc. Int. Soc. Mag. Reson. Med.*, 2004, p. 1039, vol. 11.

Lange et al. "Statistical procedure for fMRI" *Functional MRI, Springer-Verlag Press*, 1999, Ch. 27.

Moonen & Bandetti, *Functional MRI, Springer-Verlag Press*, 1999, Ch. 19, Bandettini, P.A.

Morgan, V. L. et al. "Comparison of Functional MRI Inage Realignment Tools Using a Computer-Generated Phantom" *Med. Phys.*, 2001, pp. 510-514, vol. 46.

Schenck, J. F. "The role of magnetic susceptibility in magnetic resonance imaging: MRI magnetic compatibility of the first and second kinds" *Am. Assoc. Phys. Med.*, Jun. 1996, pp. 815-850, vol. 23, No. 6.

Sorenson, J. A. et al. "ROC Methods for Evaluation of fMRI Techniques" *Magn. Reson. Med.*, 1996, pp. 737-744, vol. 36.

Tsai et al. "Analysis of functional MRI data using mutual information" *Second International Conference of Medical Image Computing and Computer-assisted Intervention*, 1999, pp. 473-480, vol. 1679.

Worsley & Friston "Analysis of fMRI time-series revisited-again" *NeuroImage*, 1995, pp. 173-181, vol. 2.

Zhao, Q. et al. "Development of Smart Phantom for Characterizing fMRI Informatics Tools" *Proc. Intl. Soc. Mag. Reson. Med.*, 2003, p. 1834, vol. 11.

Zhao, Q. et al. "Functional Magnetic Resonance Imaging Data Analysis With Information-Theoretic Approaches" *Biocomputing, Klawer Press*, 2002, pp. 159-173, Ch. 9.

\* cited by examiner

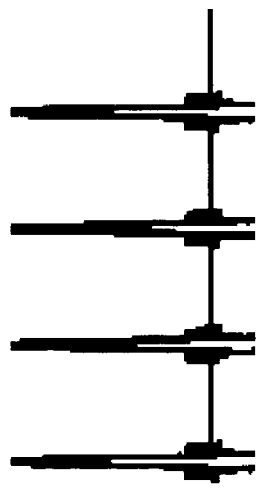
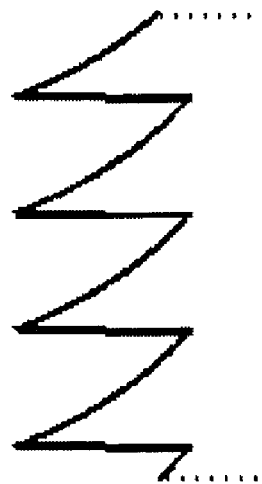
FIG. 14A
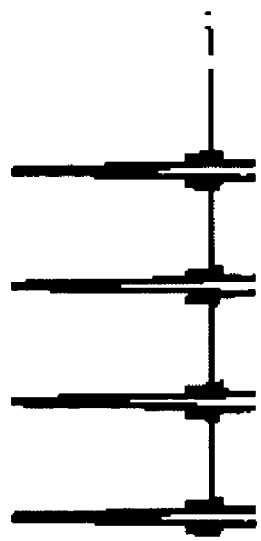
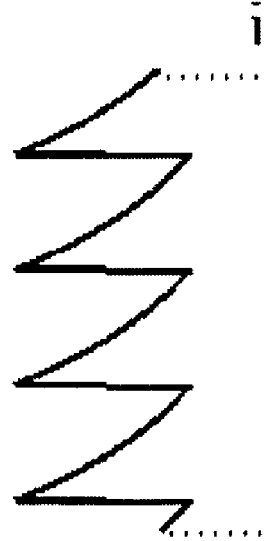
FIG. 14B
FIG. 14C

PHANTOM FOR PRODUCTION OF CONTROLLABLE FMRI SIGNAL

CROSS-REFERENCE TO RELATED APPLICATION

This application claims the benefit of U.S. Provisional Application No. 60/508,570, filed Oct. 3, 2003.

The subject invention was made with government support under a research project supported by NIH grant no. RO1EB00974.

BACKGROUND OF THE INVENTION

Over the course of the past decade, a variety of neuroimaging technologies allow the structure and function of the intact brain to be studied. This presents a tremendous opportunity to understand the human brain. Neuroimaging has the potential to reveal some of nature's most closely held and significant secrets, and informatics can assist in realizing this potential.

As defined in Neuroimaging Informatics Technology Initiative (NifTI) 2000 Workshop, "informatics, a computerized way to handle data, is used to design and implement the manner in which the imaging instruments capture signals generated by the brain, as well as the behavioral tasks used to probe particular brain systems, reconstruct the resulting signals, statistically analyze the data, and visualize the results". By this definition, it is easy to find out that the informatics includes a variety of technologies, e.g., collection of data using new acquisition techniques (e.g. phase array coil), statistical analysis and processing of data, and visualization of data. However, the great potential of informatics in neuroimaging has been impeded by inadequate coordination regarding the development and distribution of the informatics tools needed to meet this challenge. Existing informatics tools have been developed separately, and now widely used software products are not adequately optimized for meeting the variety of needs of the broader community.

There exist a strong need that the conclusions drawn from fMRI studies regarding the relationship between functional activation signals and function of the brain should be based upon a clear understanding of the manner in which various tools affect the data at each stage of processing. Knowing that the operations performed by informatics tools are valid is important for interpreting the results of fMRI studies. In addition, comparing different tools to identify the conditions under which, and uses to which, they are best suited is significant information to both the researchers and clinicians. In this background section, some recent studies of fMRI activation simulation, statistical analysis tools, and parallel MRI reconstruction using phased array coils will be briefly reviewed.

Simulation of fMRI Activation and BOLD Signals

After conception and implementation of any new neuro-imaging informatics tools, validation is an important step to ensure that the procedure fulfills all requirements set forth at the initial design stage. Manufacturer's physical phantoms were first used for this purpose. However, these are typically just static phantoms filled with water or gel. The informatics tools must be evaluated using a comprehensive validation that requires additional use of simulated data since it is very difficult to establish ground truth with in vivo data. Experiments with simulated data permit controlled evaluation over a wide range of conditions, such as different Signal-to-Noise Ratio (SNR), contrast-to-noise ratio, and signal intensities. Such considerations have become increasingly important with the rapid growth of neuro-imaging.

Computer simulations of the Blood Oxygenation Level Dependent (BOLD) signals and neural activation have been developed by many researchers. In a recent publication (Sorenson, J. A. & Wang, X, ROC methods for evaluation of fMRI techniques. *Magn. Reson. Med.*, 36:737–744 (1996)), the time course data was represented by a zero-baseline boxcar function. Gaussian noise was added to simulate physiologic "noise", after which the data were convolved with a Poisson function to simulate hemodynamics smoothing and delay. Also, structured noise in the form of slopes to simulate signal drift and sinusoidal oscillations to simulate respiratory motion were added. These simulated fMRI responses were finally added to null data sets acquired on normal subjects, denoted as "human data". In one study (Constable, R. T. et al. Quantifying and comparing region-of-interest activation patterns in functional brain MR imaging: methodology considerations, *Magnetic Resonance Imaging*, 16(3):289–300 (1998)), Gaussian-shaped activation signals were added with Gaussian distribution of white noise.

Another study (Morgan, V. L. et al. Comparison of functional MRI image realignment tools using a computer-generated phantom. *Magn Reson Med.* 2001 September; 46(3):510–4) discussed the development of a computer-generated phantom to compare the effects of image realignment programs on functional MRI (fMRI) pixel activation. The phantom is a whole-head MRI volume with added random noise, activation, and motion. It allows simulation of realistic head motions with controlled areas of activation. Without motion, the phantom shows the effects of realignment on motion-free data sets. Prior to realignment, the phantom illustrates some activation corruption due to motion. A recent paper (Desco, et al. Multiresolution analysis in fMRI: sensitivity and specificity in the detection of brain activation. *Hum Brain Mapp.* 2001 September; 14(1): 16–27) presents a study that was undertaken to assess the performance of different wavelet decomposition schemes by making use of a "gold standard," a computer-simulated phantom. As activation areas are then known "a priori," assessments of sensitivity, specificity, ROC curve area, and spatial resolution can be obtained. This approach has allowed the study of the effect of different factors: the size of the activation area, activity level, signal-to-noise ratio (SNR), use of pre-smoothing, wavelet base function and order and resolution level depth. Recently, a Functional Data Simulator has been provided by SENSOR SYSTEMS (Medical Numerics, Inc., Sterling, Virginia) in their software package MEDx. This functional data simulator (MEDx) is a graphical tool for constructing curves of signal intensity vs. time at a single pixel and then extrapolating to volumetric data. It can also be used to create synthetic fMRI data for similar exploration of the effects of noise and timing.

However, these studies, while providing a simulated activation signal, do not account for variations in the activation levels of different pixels and are unable to depict accurately the temporal response of the activation associated signal change. And the most important issue is that these simulations do not account for the real MR imaging environment (non-stationary rather than stationary, or dynamic rather than static), spin characteristics and the noises introduced during the whole imaging process, i.e. noises from MR power system, pre-amplifier, transmit/receive, and digitization (A/D) error.

By reviewing the literature, one can see that there are very limited measurements, such as the signal-to-noise ratio or contrast-to-noise ratio, where static phantom (a simple container full of liquid) has usually been used that provides static MR signals instead of dynamic signal changes. As for the fMRI research, systematic comparison of the analysis methods presented in fMRI cannot be conclusive if assessment is based only on the highly variable activity of the human brain. Calibrated, repeatable fMRI signals are needed for a reliable validation.

Statistical Analysis of Activation

In recent years, a variety of advanced high performance informatics tools have emerged for statistical pattern mapping of functional data and fMRI data visualization. Among them are the general-purpose fMRI analysis packages, such as AFNI, Brain Voyager™, BrainTools, FIASCO, fmristat, iBrain, Lyngby, MEDx, scanSTAT, and Statistical Parametric Mapping (SPM) as well as Special-purpose software packages, such as AIR, ANALYZE, ANIMAL, FreeSurfer, and SureFit. Qualitative characterizations and comparisons have been done (Gold et al. Functional MRI statistical software packages: a comparative analysis. *Hum Brain Mapp.* 1998;6(2):73–84, Lange et al. Staatistical procedure for fMRI. Chapter 27 in *Functional MRI*, C. T. W. Moonen & P. A. Bandettini (Eds), Springer-Verlag (1999)). However, due to lack of a benchmark database, quantitative validation and comparisons of these tools are difficult and sometimes impossible.

The field of fMRI has been dominated by the notion of detectability of activation in a noisy background, and tremendous effort has been placed in the area of statistical signal detection methods. Among these statistical methods, some provide maps or images of descriptive statistics, such as z-score, statistical t-test, General Linear Model (GLM), and Kolmogorov-Smirnov test. Generally speaking, all such maps represent a ratio of the activation magnitude to the measured signal variation.

Based on the differences in model, these techniques can be divided into two groups. The first is the parametric group. In general, parametric approaches depend on assumptions about the possible parametric families of distributions generating the fMRI data. They attempt to determine the value of a parameter or parameter vector that identifies a particular member among a large parametric family of plausible probability distributions that generate the fMRI data. The parametric group includes for example the statistical t-test, cross-correlation, and general linear model (Friston et al. Statistical parametric maps in functional imaging: A general linear approach. *Human Brain Mapping*, 2:189–210 (1995), Worsley & Friston Analysis of fRMI time-series revisited-again. *NeuroImage*, 2:173–181 (1995)), uni-variate time series models, analysis in frequency domain, and longitudinal data analysis.

The second group is the non-parametric approaches, which make no assumptions about the possible parametric families of distributions generating the fMRI data and are thus less dependent on a specific statistical model. While this seems attractive, there is another side. If parametric assumptions are roughly correct, then a parametric, model-based approach is superior to one that does not employ these assumptions. However, the difficulty is that it is usually difficult to know the properties of the true data-generating mechanism, and some statistical compromise between knowns and unknowns is often a pragmatic course of action. The non-parametric statistical procedures include, for example, the Kolmogorov-Smirnov (KS) test, probabilistic analysis (Frank et al., Probabilistic analysis of fMRI data, *Magnetic resonance in medicine*, 39:132–148 (1998)), information-theoretic methods (Tsai et al., Analysis of functional MRI data using mutual information. *Second International Conference of Medical Image Computing and Computer-assisted Intervention,* 1679:473–480 (1999); Zhao, et al. 2002 Zhao, Q., Principe, J. C., Fitzsimmons, J., Bradley, M. M., Lang, P. J. (2001), "functional Magnetic Resonance Imaging Data Analysis with Information theoretic Approaches", "*Biocomputing*", edited by Panos Pardalos and Jose Principe, Chapter 9, pp. 159–174, Kluwer, 2002, and some modern computational non-parametric statistics (e.g., permutation, jackknife and bootstrap procedure).

However, there is very limited published information about how various tools affect the data at each stage of processing, what operations performed by informatics tools are valid, and under what conditions they are best utilized. A standard procedure or ground truth is needed for an objective characterization and comparison.

Establishing Ground Truth

Informatics tools are important both to performing neuro-imaging studies, and to understanding the results. After conception and implementation of fMRI informatics tools, validation is an important step to ensure that the procedure fulfills all requirements set forth at the initial design stage. Though these tools must be evaluated on real data, a comprehensive validation should ideally involve the additional use of simulated data with known parameters, since it is very difficult to establish ground truth with in vivo data. Qualitative analyses of various informatics tools have been done using computer-simulated functional activation signals. However, these computer-simulated data are usually simply overlapped on top of anatomic images, they cannot reflect the real MR imaging process, such as the MR spin characteristics and noises introduced during the process, i.e. noise from MR power system, pre-amplifier, transmit/receive, and digitization (A/D) error. Besides, due to lack of a highly characterized data set available to the research community, it is difficult to make an objective comparison of the fMRI informatics tools. A quantitative measurement tool is needed to provide data that presents the MR imaging process, the ground truth, in order to characterize and compare informatics tools.

Defining the Effect of Statistical Analysis Tools

Informatics tools are key to all stages of fMRI. However, there is very limited published information about several fundamental aspects of informatics tools. These issues include a clear understanding of the manner in which various tools affect the data at each stage of processing, the knowledge of under what conditions operations performed by informatics tools are valid, and comparisons of different tools to identify the conditions under which they are best utilized.

Calibration of Different fMRI Experiments

Currently, numerous fMRI exams are conducted on various MRI scanners (e.g., General Electric Medical Systems, Siemens Medical Solutions, Philips Medical Systems) at different field strength (e.g., 1.5 T and 3.0 T) and with different pulse sequences (e.g., EPI, Spiral), head coils (e.g., birdcage, phased array) or protocols. With so many variables, comparison of the results become extremely difficult, making it uncomfortable to share the findings from different research groups. Therefore, a calibration tool which acts as a reference or benchmark of the specific exam is highly needed to provide useful information for comparison of the results.

Accordingly, considering all these problems, there is a need for a physical fMRI simulation device or phantom.

There is a need for a device which can provide variable contrast of signals, with intensity changes following the BOLD signals, and can allow the optimization of imaging protocols. Also, there is a need for a device that can produce signals, such that the acquired signals from such a device can provide a gold standard for characterization, validation and comparison of various informatics tools. Furthermore, there is a need for a physical phantom which can provide means for instantly checking system performance. In addition, there is a need for a device or phantom that can provide one or more of the following features: a complete MR system and MR platform independent; have complete control over timing or delays, signal intensity level, motion, and physiological "noise" such as cardiac and respiratory signals; provide self-testing for quality control; and be easy to use and transportable.

BRIEF SUMMARY OF THE INVENTION

The subject invention relates to a method and apparatus for producing simulated fMRI data. In an embodiment, the subject invention pertains to a remote-controlled "smart phantom" that can produce simulated fMRI data. In an embodiment, the simulated fMRI data can first be acquired from a MI system. The subject device can generate control signals and send the generated control signals to secondary coils/probes placed in the subject smart phantom. The control signals can determine the current flow in the secondary coils/probes by adjusting the impedance of the secondary coils/probes, which can act as local spin magnetization amplifiers and thus produce regions of variable contrast to noise ratio. The control signals can be generated with various parameters, such as hemodynamic response models and different levels of enhancement and physiological noises. Comparisons can be made with the widely-used simulated data by computers. Validation of the subject smart phantom can be achieved with theoretical analysis and/or with data of human subjects.

The data associated with the use of the subject smart phantom can be used to establish a benchmark database, an Informatics Development and Support Database for fMRI. This database can also be used to document the performance of registered informatics tools for storage with respect to the user-adjustable informatics parameters, the user-selected data sets processed, and the resulting visualization.

The subject smart phantom can enable quantitative and objective characterization and comparison. For example, functional activation detection can be investigated and compared among the general-purpose and/or other statistical analysis packages. Sensitivity and specificity can be validated and compared by using the Receiver Operation Characteristics (ROC) curve under different levels of signal intensities, CNR, spatial resolution, and physiological spectral background. Various methods of motion correction can be characterized and compared using data acquired from accurately controlled motion of the subject smart phantom. Spatial and temporal filtering can also be characterized and compared.

DETAILED DESCRIPTION OF THE FIGURES

FIG. 14A shows the form a pulse pattern of an excitation RF magnetic field $B_1$ that can be used to excite a sample material in accordance with an embodiment of the subject invention.

FIG. 14B shows the form of the rotating magnetization M of a sample material located in a static magnetic field $B_o$ and excited with the excitation RF magnetic field $B_1$ shown in FIG. 14A.

FIG. 14C shows the DC current that can drive one or more DC coils associated with a magnetic field parallel to the static magnetic field $B_o$ to produce a static magnetic field opposed to field $B_o$ or additive with field $B_o$, in accordance with an embodiment of the subject invention.

DETAILED DISCLOSURE OF THE INVENTION

The subject invention relates to a method and apparatus for producing simulated fMRI data. In an embodiment, the subject invention pertains to a remote-controlled "smart phantom" that can produce simulated fMRI data. In an embodiment, the simulated fMRI data can first be acquired from a MRI system. In this sense, the MRI data is data actually acquired from a MR scanner, but the MRI data is referred to as "simulated" fMRI data because it is not acquired from the dynamic activity of a patient. The subject device can generate control signals and send the generated control signals to secondary coils/probes placed in the subject smart phantom. The control signals can be used to adjust the impedance of the secondary coils/probes so as to determine the current flow in the secondary coils/probes, which can act as local spin magnetization amplifiers and thus produce regions of variable contrast to noise ratio.

The subject invention can involve the placement of a sample material in a region of interest in a static magnetic field $B_o$. The sample material in the static magnetic field $B_o$ will have a magnetization M. One or more RF coils can be positioned in the static magnetic field proximate the sample material. For purposes of ease of description, the following is a discussion of a single RF coil. The RF coil is associated with a magnetic field having a component perpendicular to the static field $B_o$ in the region of interest. Of course, the magnetic field associated with the RF coil changes direction as a function of position and, as the static magnetic field $B_o$ has a fairly uniform direction in the region of interest, the relative direction of the magnetic field associated with the RF coil and the static field $B_o$ will change as a function of position as well. Preferably, the magnetic field associated with the RF coil is perpendicular to the static filed $B_o$ in the region of interest More preferably, the RF coil is planar and has a normal perpendicular to the static field $B_o$. This discussion can be applied to additional RF coils employed in multi-RF coil embodiments.

Figure 13A:
FIG. 13A shows the form a pulse pattern of an excitation RF magnetic field $B_1$, that can be used to excite a sample material in accordance with an embodiment of the subject invention.
Figure 13B:
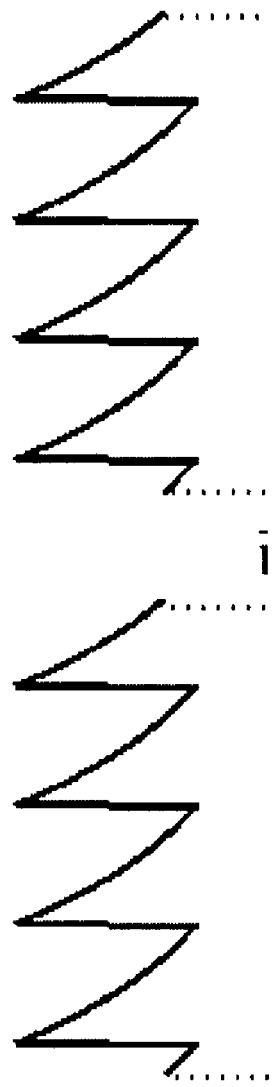
FIG. 13B shows the form of the rotating magnetization M of a sample material located in a static magnetic field $B_o$ and excited with the excitation RF magnetic field $B_1$ shown in FIG. 13A.
Figure 13C:
FIG. 13C shows the form of the induced RF magnetic field $B_2$ in a RF coil position proximate to the sample material for which the rotating magnetization is shown in FIG. 13B, wherein the RF coil is decoupled during the last portion of the plot.

An excitation RF magnetic field $B_1$ is applied to the sample material so as to tilt the magnetization M of the sample material. Referring to FIG. 13A, the excitation field $B_1$ can be applied as a series of pulses to form a pulse pattern. The RF coil can be decoupled during each pulse to reduce or eliminate fields that would be produced by the RF coil by the field $B_1$. After each pulse of field $B_1$, the RF field produced by the rotating magnetization M induces a voltage V in the RF coil. The induced voltage produces a current I=V/Z in the RF coil, where Z is the impedance of the RF coil. The current I flowing in the RF coil then produces an induced RF magnetic field $B_2$. FIG. 13C shows the form of a $B_2$ field that can be produced in an embodiment of the invention. The $B_2$ field shown in FIG. 13C is positive for the early pulses because the impedance of the RF coil is adjusted accordingly. The $B_2$ field shown in FIG. 13C is zero for the later pulses because the RF coil is decoupled. Adjustment of the impedance Z of the RF coil alters the induced magnetic filed $B_2$ for the same static magnetic field $B_o$, the same sample material, and the same excitation RF magnetic field $B_1$. Adjustment of the impedance of the RF coil can be accomplished by adjusting the resistance of the RF coil.

The means for detecting the net RF field over the region of interest can then measure the net RF field $B_{net}$. This means for detecting $B_{net}$ can be, for example, one or more receive coils. A voltage is produced in each receive coil due to $B_{net}$ to produce a portion of a MRI signal. When the RF coil is not decoupled, $B_{net}$ is the vector sum of $B_M$ and $B_2$, after exciting the sample material with excitation field $B_1$, where $B_M=\mu_o M$, M is the rotating magnetization of the sample and $\mu_o$ is the magnetic permeability of free space. When the RF coil is decoupled, $B_{net}$ is $B_m$ after exciting the sample material. In an embodiment, excitation field $B_1$ can be delivered in pulses separated by periods where $B_1$ is turned off, such that the net RF field can be measured between adjacent pulses of excitation field $B_1$. The means for detecting can then provide a first portion of an MRI signal when $B_2$ is non-zero and a second portion of the MRI signal when the RF coil is decoupled (or has very high impedance) and $B_2$ is zero. These two portions of the MRI signal can then be used to produce simulated fMRI data. In a specific embodiment, the second portion of the MRI signal can result from detection of $B_{net}$ when $B_2$ is non-zero and the impedance of the RF coil has been adjusted with respect to the detection of $B_{net}$ to produce the first portion of the MRI signal, in contrast to decoupling the RF coil during the production of the second portion of the MRI signal.

The resulting simulated fMRI data can be compared with the known excitation pattern to analyze the simulated fMRI data. In specific embodiments, the simulated fMRI data includes a portion of a MRI signal when the RF coil is decoupled, representing no stimulation of the simulated patient and a portion of the MRI signal when the RF coil is not decoupled representing stimulation of the simulated patient. As in actual fMRI measurements, various permutations of stimulation and no stimulation can be utilized. For example, the stimulation can be pulsed.

In a specific embodiment, the RF coil is positioned parallel to the static magnetic field $B_o$ such that the RF coil is associated with an RF magnetic field that is perpendicular to the static magnetic field. Stated another way, for an embodiment using a planar coil, the normal of the plane of the coil is perpendicular to the static magnetic field. Although it is preferred to used RF coils associated with RF magnetic fields, perpendicular to the static field $B_o$, RF coils positioned at an angle to the static magnetic field $B_o$ can also be utilized. Of course, with most RF coils the direction of the associated magnetic field changes as a function of position, such that the relative direction of the static field $B_o$ and the associated magnetic field changes with position as well. In this way, the relative directions of the associated field and the static field $B_o$ may be perpendicular over a certain region. In an embodiment, this can be considered the region of interest.

One or more additional RF coils can also be positioned proximate the sample material in much the same way as the first RF coil. Preferably, an additional RF coil is at an angle with respect to first RF coil, such that the additional RF coil is associated with an RF magnetic field that has a component perpendicular to the static magnetic field and perpendicular to the component of the first RF coil that is perpendicular to the static magnetic field. For example, if the static magnetic field is parallel to the Z-axis and the first RF coil is associated with an RF magnetic field having a component in the X direction, the additional RF coil preferably is associated with an RF magnetic field having a component in the Y direction. If the first RF coil and the additional RF coil are planar, another description is that the normal to the plane of the first RF coil has a component in the X direction and the additional RF coil has a component in the Y direction. A most preferred embodiment involves two planar RF coils that are both parallel to the static magnetic field and the normals to the planes of the two RF coils are perpendicular to each other. Although planar coils may be preferred in some applications, a variety of RF coils can be utilized, including, but not limited to the following: Aldermann-Grant, Helmholtz, ring, square, rectangular, and birdcage.

The subject invention also pertains to the incorporation of one or more coils for producing dc magnetic fields parallel to the static magnetic field $B_o$. Such dc field coils can be used in conjunction with one or more RF coils as discussed above or can be used without the RF coil(s). Preferably the dc field coil is associated with a dc field parallel to $B_o$ in the region of interest. Most preferably, the dc field coil is a planar coil having a normal parallel to $B_o$. The dc field coil(s) then change the net static field experienced by the sample material located in the region of interest. Although it is described as changing the static field, it is understood that the dc current driving the dc coil can be made to vary such that the static field in the direction of $B_o$ is in fact a dynamic field. In fact, the dc coil(s) can be driven with dynamically varying currents that include a model of one or more physiological functions, or other conditions to be modeled, such as patient's breathing. Again, the strength and direction of the magnetic fields associated with the dc coil(s) varies with position so that the dc coil(s) changes the field in the direction of the static field $B_o$ as a function of position.

For example, if the static field coil produces a static field component in the direction parallel to $B_o$ of $B_s$, then the net static field in the direction parallel to $B_o$ is $B_o + B_s$, if $B_S$ is in the same direction as $B_o$, and $B_o - B_S$, if $B_S$ is in the opposite direction of Bo. This change in the static field can alter the T2* relaxation of by the sample material and, therefore, the resulting magnetic field $B_M$ of the rotating magnetization M, where T2* characterizes the decay of the transverse component of the magnetization after excitation. FIGS. 14A–C show an excitation field $B_1$, the resulting magnetic field $B_M$ of the rotating magnetization M, and the DC current that can drive a coil for producing a static magnetic field parallel to the direction of $B_o$, respectively, in accordance with an embodiment of the subject invention. In a further embodiment, the excitation of FIG. 14A and the DC current of FIG. 14C can be applied to the embodiment of FIG. 11 having only one DC loop.

A variety of sample materials can be utilized in accordance with the subject invention. The sample material can be chosen to have magnetic properties of another object or material such as a human brain, a human heart, and/or a human bone. In a specific embodiment, a gel, such as an agarose gel, can be used. The gel can incorporate substances which alter its properties. An example includes an agarose gel with copper sulfate. In this example, the concentrations of agarose and copper sulfate can be adjusted to match a particular material such as human brain tissue. In a specific embodiment, the sample material can be selected so as to have a T1 value, T2 value, and/or T1/T2 ratio in a certain range. All or a portion of the sample material can also be moved during the production of the simulated fMRI data. Such motion can be periodic, if desired, so as to model, for example, breathing. In additional embodiments, the sample material can flow through a conduit during the production of the simulated fMRI data. Such flowing of the sample material can be used to, for example, model blood flow. The properties of the flowing sample material can be adjusted during the production of the fMRI data. This can be utilized to model a dynamically changing model material. One or more of the RF coils and/or static field coils can be moved during production of the simulated fMRI data. The shape of the sample material can also be changed to model a certain object and/or material. For example, a cavity within the sample material can be expanded and contacted during the production of stimulated fMRI data and/or the sample material can be expanded and/or contracted. In an embodiment, one or more RF shields can be incorporated to shield some of the sample material from the magnetic field $B_2$ and/or from the excitation field $B_1$, in order to assist in the creation of a known enhancement pattern with known characteristics.

Preferably, the sample material has a high proton density and a T2 relaxation that is long enough to provide sufficient stimulated fMRI data, where the T2 relaxation time characterizes the decay of the transverse component of the magnetization caused by spin-spin interaction after excitation. A gel having water can be used and can have additives to adjust the T2 and T1 of the gel in order to have the desired properties. In an agarose gel, copper sulfate can be used to adjust the T1. Human brain grey matter has a T1 and T2 of approximately 1000 ms and 90 ms, respectively. The sample material can also be water doped with different ions, oils, and/or organic material such as polyvinyl alcohol so as to have T1 and/or T2 comparable to a desired tissue to model, such as a human brain.

In a specific embodiment, the subject invention pertains to a functional magnetic resonance imaging (fMRI) activation simulator and a method of providing simulated fMRI activities. The subject fMRI activation simulator can generate simulated functional changes based on known, controllable signal input. When placed in an MRI scanner the subject phantom can produce calibrated and repeatable fMRI activities, so as to permit an objective, systematic comparison of fMRI analysis methods. The controllable signal input can allow such factors as hemodynamic delay to be taken into account, and can allow control of the shape of the output signal so as to, for example, control contrast.

The subject phantom can simulate various hemo-dynamic response models, smoothing and delay, and cardiac and respiratory "noise". The subject phantom can simulate the neural activation signal and produce a signal intensity change resembling the physiological data. The subject phantom can provide a means to characterize, validate, and compare informatics tools, as well as be used for MRI quality control.

Figure 1A:
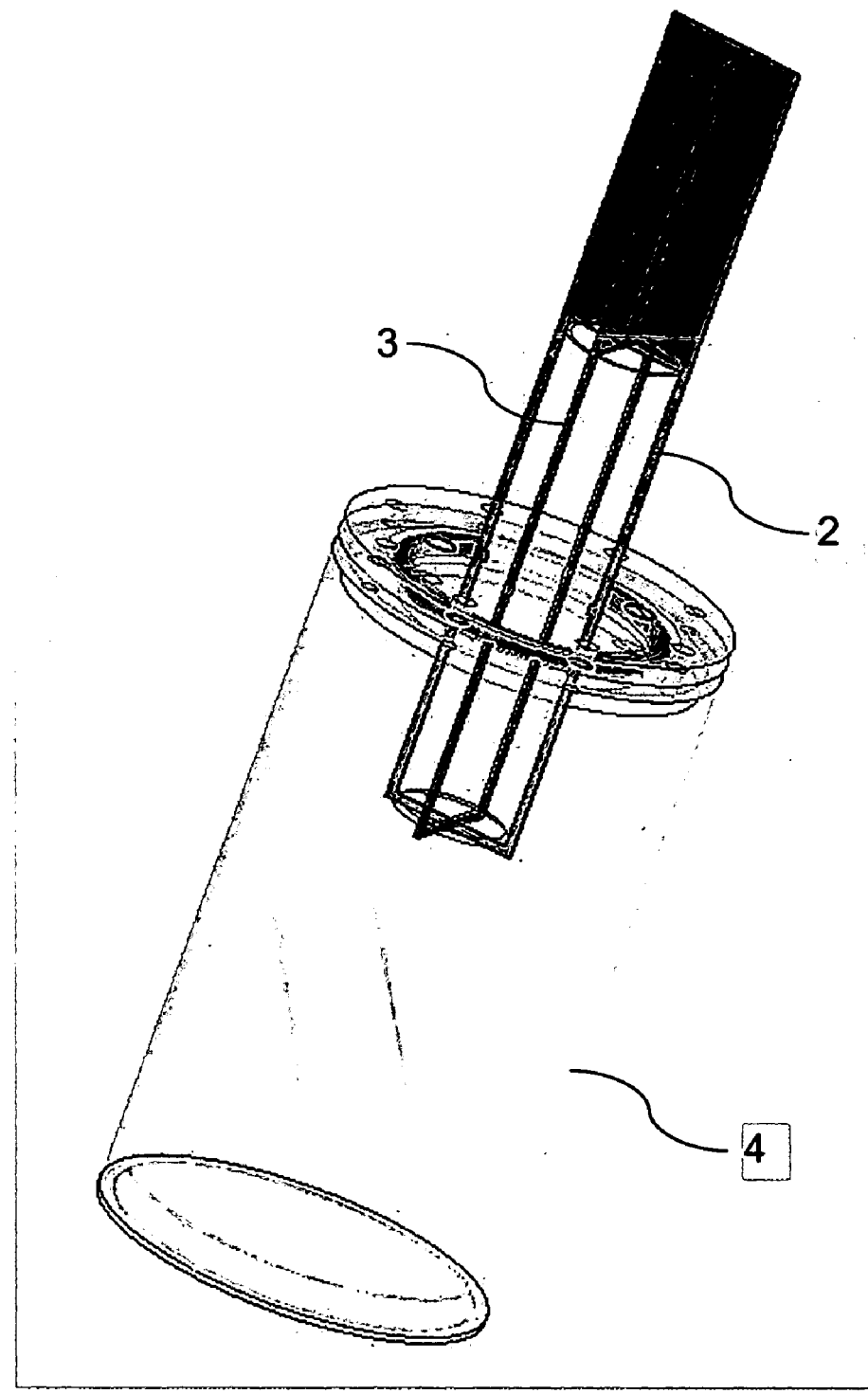
FIGS. 1A–1C show a specific embodiment of a phantom in accordance with the subject invention incorporating two planar rectangular loops.
Figure 1B:
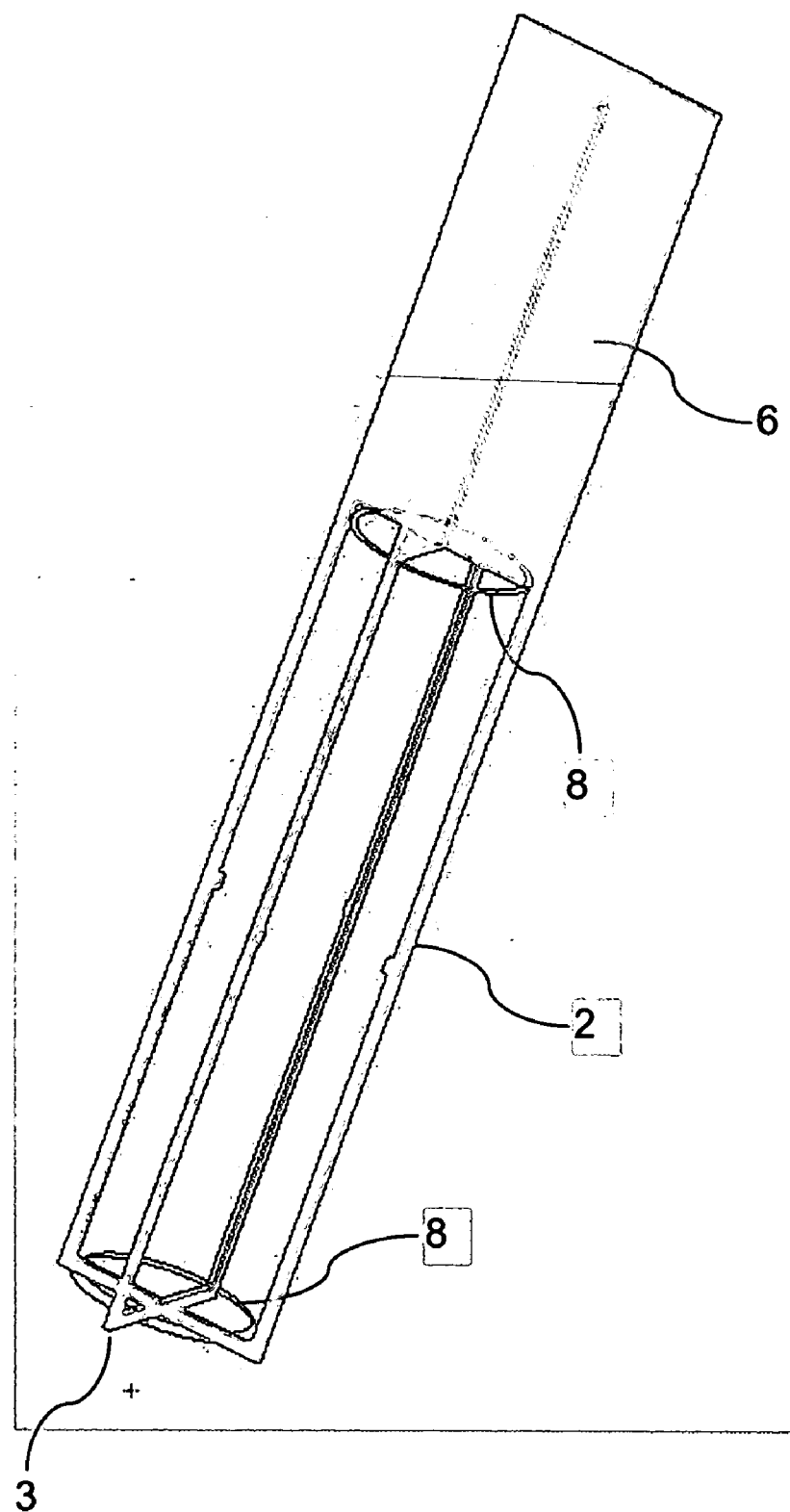
Figure 1C:
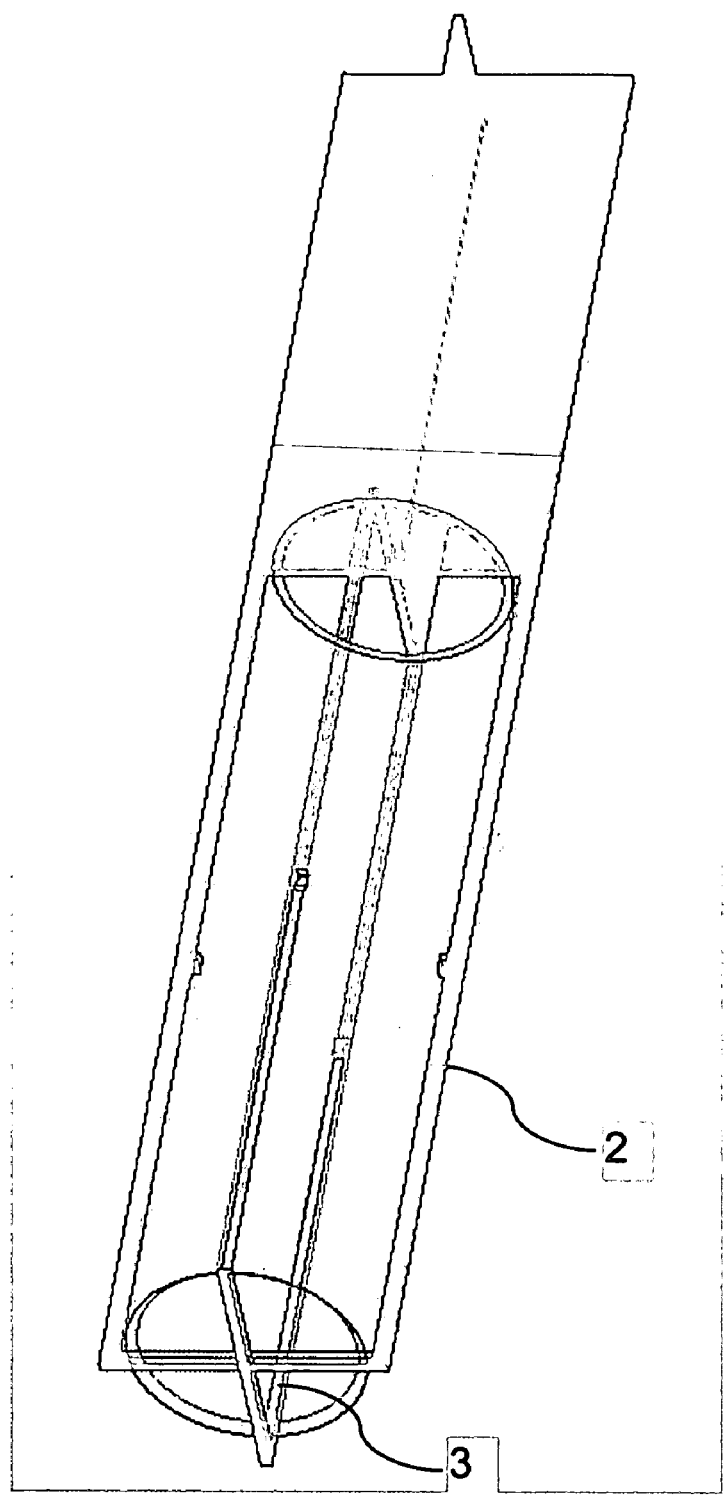

FIGS. 1A–1C shows an embodiment of the subject smart phantom incorporating two planar rectangular RF probes/coils 2, 3 placed into a cylinder 4. FIG. 1A shows the probes 2, 3 during insertion into cylinder 4. Excitation of the RF coils induce magnetic field changes and thus produce regions of variable MR image contrast to noise. The excitation of the RF coils can be under the control of a computer. The RF coils can be oriented such that the magnetic field associated with driving a current through the RF coil has a component perpendicular to the main static magnetic field of the MRI MR scanner into which the subject phantom is placed. Stated another way, the normal to the plane of the planar RF coils has a component perpendicular to the main static magnetic field $B_o$. In the embodiment shown in FIGS. 1A–1C, the RF probe is a quadrature secondary coil, having two planar rectangular loops in parallel with the static magnetic field, such that the normal of each of the planes associated with the planar loops is perpendicular to the main static magnetic field $B_o$. In the embodiment of FIGS. 1A–1C, the two planar loops are placed at a 90 degree angle with respect to each other. In alternative embodiments, the two loops can be placed at other angles with respect to each other or can be parallel to each other. In the embodiment shown in FIGS. 1A–1C, the two loops are planar rectangular and are positioned to form an inner cylinder 8, where the inner cylinder 8 shown in FIGS. 1A–1C in outline form. Sample material can be placed inside the inner cylinder 8 of the subject phantom in sufficient proximity to the RF coils that the rotating magnetization of the sample material can reach the RF coils so as to have a meaningful impact on the MRI measurements. In a specific embodiment, a container having a sample material can be located such that at least a portion of the sample material is located within the inner cylinder 8 formed by the surface loops. In an embodiment, the sample material can be located within a cylindrical container and the cylindrical container can be placed inside the two loops.

Referring to the embodiment shown in FIGS. 1A–1C, the two planar rectangular loops travel up the outside of the structure from the bottom and the travel toward the central axis of the inner cylinder 8 at the top of the inner cylinder formed by the loops, leaving the top portion 6 to house the circuitry of the loops, which can be used to, for example, control the impedance of the loops.

Figure 2:
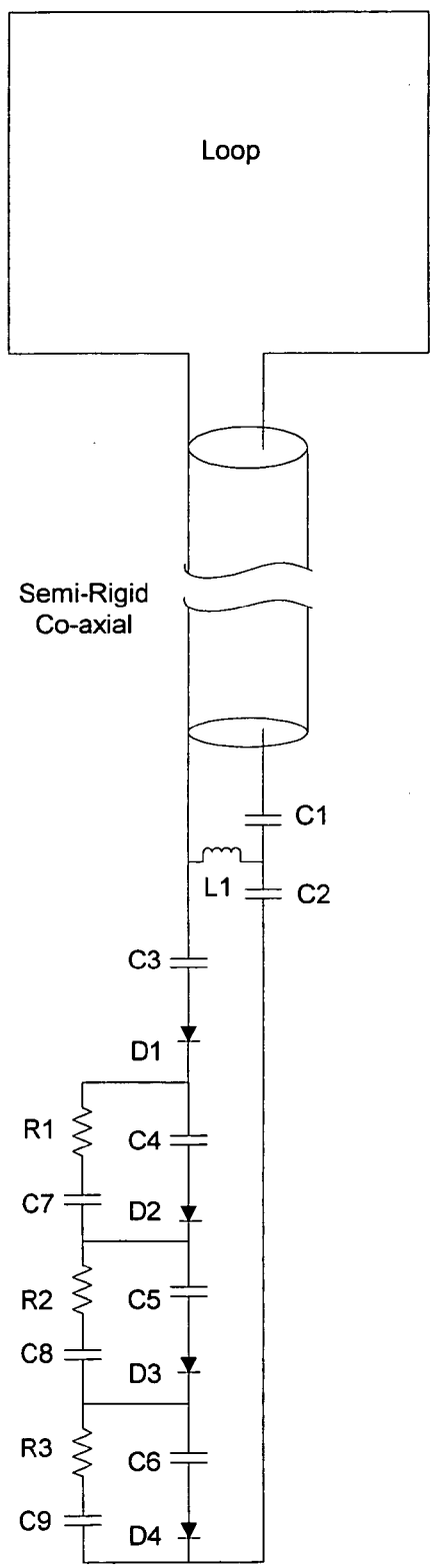
FIG. 2 shows a schematic diagram of a loop of a quadrature secondary coil incorporated with the phantom shown in FIGS. 1A–1C.

A schematic diagram of a specific embodiment of a loop in accordance with the subject invention is shown in FIG. 2. In this embodiment, the diode symbol represents a PIN diode. During transmit, or excitation of the sample material with excitation RF magnetic field $B_1$ by the MR Scanner, the PIN diodes $D_1$, $D_2$, $D_3$, and $D_4$ can be reverse biased such that no current flows in the circuit, such that the RF coil is decoupled. During receive, or collection of data by the MR Scanner, the resistors of the resistor array can be switched in and out, by turning on and off each individual PIN diode. The resistor array can be controlled so as to adjust the impedance of the RF coil in order to achieve a desired degree of signal enhancement. When a sample material is placed in the static magnetic field of the MR Scanner and excited with an excitation RF magnetic field $B_1$, the magnetization of the sample material M will rotate. The rotating magnetization M induces a voltage in the RF coil, which induces a current to flow in the RF coil. The current flowing in the RF coil produces an induced magnetic field $B_2$. In an embodiment, the loop can be tuned such that it is purely resistive at resonance. In an embodiment, the induced current can be 90 degrees out of phase with the applied magnetization, such that the signal from the loop and the signal from the sample material magnetization can be added in quadrature. The control signal for controlling the impedance of the RF coil can be produced by computer simulation, which can provide, in various embodiments, one or more of the following functions:

(1) A range of enhancement level (for example from 1% to 10%) can be provided over regions of interest. Positive and negative enhancement levels can be provided and, in an embodiment, enhancement levels can between about 0.25% and about 10% can be provided. Enhancement levels higher than 10% can also be achieved.

(2) Typical hemo-dynamic waveforms (e.g., Boxcar, Gamma, Gaussian) can be provided.

(3) Duty cycle (on-off duration) control can be provided, such that each cycle can have a variable or fixed stimulus/on period and a variable or fixed control/off period.

A synchronization signal (e.g., transmit unblank from MR scanner) can be utilized to start the computer sending the control signal, in synchronization with thee functional scan.

Figure 3:
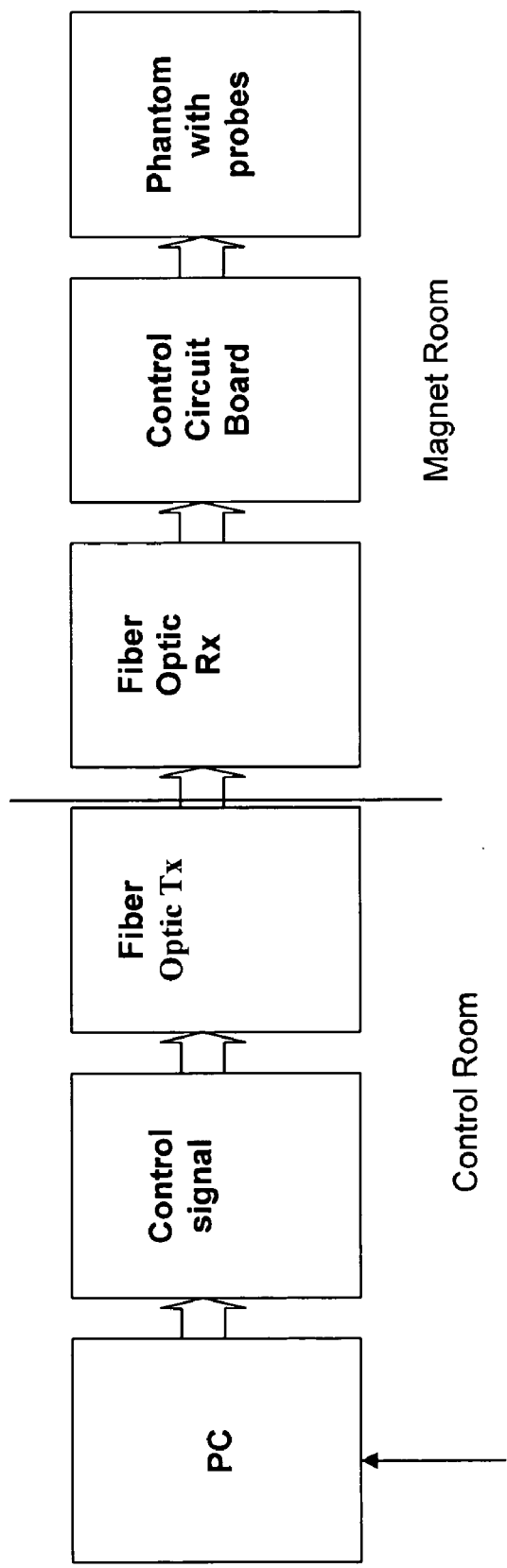
FIG. 3 shows a diagram of a specific embodiment of a smart phantom implementation system in accordance with the subject invention.

A diagram of a specific embodiment of a smart phantom implementation system in accordance with the subject invention is shown in FIG. 3. A personal computer (PC) can be used as a main control unit, which sends out the control signals. In a specific embodiment, the signal transmission between the PC (in the control room) and the subject phantom (in the magnet room) can be done using fiber optics. A shielded control circuit board can be used to magnify the signal before it is sent to the coils/probes in the subject phantom.

The subject invention can also be utilized to evaluate an algorithm for analyzing fMRI data. In an embodiment, simulated fMRI data with a known enhancement pattern can be provided, the simulated fMRI data can be analyzed via an algorithm for analyzing fMRI data to create a prediction of the known enhancement pattern and the prediction of the known enhancement pattern can be compared to the known enhancement pattern. In a further embodiment, one or more parameters of the algorithm can be adjusted and the simulated fMRI data can be reanalyzed. The adjusted prediction of the known enhancement pattern can be compared to the known enhancement pattern. The adjustment of parameters and comparisons can be repeated until the comparison indicates an effective match between the adjusted prediction and the known enhancement pattern is achieved. If desired, the adjusted algorithm can then be utilized to analyze fMRI data from a patient. In a specific embodiment, the method of evaluating an algorithm for analyzing fMRI data can utilize simulated fMRI data produced via the use of the subject phantom as described herein.

There are many popular software packages that utilized methods for analyzing fMRI data. We have compared SPM (statistical parametric mapping), FSL (FMRIB Software Library), and BrainVoyager™. Another example of a software package that analyzes fMRI data is AFNI (Analyses of Functional Neuroimages).

There are a number of parameters that can be adjusted for each of these packages. In an embodiment, the subject smart phantom can be used to adjust the algorithm, by adjustment of parameters, to achieve an appropriate P value (a threshold that determines which voxel is activated) of the statistical map. In an embodiment where the subject phantom provides motion of the sample material, RF coils, DC coils, and/or the entire phantom, the best motion correction parameters, such as basis choice and interpolation methods can be arrived at. In an embodiment where the phantom provides physiological noise, such as respiratory and cardiac perturbation, the best parameters of temporal smoothing can be arrived at.

Design Scheme I

In a specific embodiment, the subject phantom can provide four or more RF probes/coils. In a further specific embodiment, each loop can be about 2.5 cm×5 cm. In alternative embodiments, and RF coil has a maximum length in at least one dimension of less than 4 cm. and/or a maximum length in at least one dimension of less than one-third the maximum length of the sample in the same dimension. Each RF loop can be strategically placed in the phantom such that the magnetic field associated with driving a current through the RF loop has at least a component perpendicular to the static magnetic field $B_o$ of the MR scanner into which the subject phantom is placed. In an embodiment, the loop(s) can be placed parallel with the static magnetic field $B_0$. In an embodiment utilizing a head phantom, coils can be placed at positions that approximate the location of the primary visual cortex, the location of the motor cortex, and the location of the auditory cortex. The probes act as local spin magnetization amplifiers and thus produce regions of variable MR image contrast to noise.

The control signal can be produced by a personal computer (PC), and can provide, for example, the following functions:

(1) A range of enhancement level from, for example, 1–10% can be modeled over each region of interest. In a specific embodiment, enhancement levels of 0.25%–1% can be modeled as well. Positive and/or negative enhancement levels can be produced, as can enhancement levels higher than 10%.

(2) Typical BOLD modeling (Poisson, Gamma, Gaussian)

The fMRI time series signal (hemodynamic response) at time t due to neuronal activity x(t) (sensory or cognitive stimulation) is denoted by y(t), the coupling between the neuronal activity and hemodynamic response is given by $$y(t)=\gamma x(t) \cdot h(t)+n(t) \quad (1)$$

where '·' denotes convolution, γ denotes the gain of the fMRI imaging process and n(t) represents the noise. The h(t) is the hemodynamic modulating function or hemodynamic "impulse response" of the BOLD signal. The h(t) has been modeled as different functions, such as a Poisson function, a Gamma function, and a Gaussian function. Therefore, these, and/or other, functions can be employed in the BOLD signal modeling for the phantom. The mathematical forms of these functions can be represented as follows:

a. Poisson function $$h(t) = \frac{\lambda^t e^{-\lambda}}{t!} \quad (2)$$

where λ represents the lag and dispersion.

b. Gaussian function $$h(t) = \frac{1}{\sqrt{2\pi\sigma^2}} \exp\left(-\frac{(t-\mu)^2}{\sigma^2}\right) \quad (3)$$

where μ and σ are the mean and standard deviation (or lag and dispersion) of the function.

c. Gamma function $$h(t) = \frac{(t/\tau)^{n-1} e^{-t/\tau}}{\tau(n-1)!} \quad (4)$$

where t is time, τ is a time constant, and n is a phase delay. A pure delay between stimulus onset and the beginning of the fMRI response is also allowed. The pure delay here accounts for any systematic asynchrony between stimulus onset and data acquisition and for any real delay between stimulus onset and hemo-dynamic response.

Most fMRI studies have been focused on neural activation analysis and have showed the timing issue. As reviewed in Chapter 19 of Moonen & Bandettini (Eds.) (1999) *Functional MRI*, Springer-Verlag, with activation, the time for the BOLD response to first significantly increase from baseline is approximately 2 s. The time to plateau in the on state is approximately 6–9 s. With cessation of activation, the time to return to baseline is longer than the rise time by about 1 or 2 s. Several groups have reported a pre-undershoot or initial dip during the first 500 ms to 2 s of the signal. More commonly observed is a post-undershoot, which is observed more in visual cortex than in motor cortex and has an amplitude that is dependent on stimulus duration.

The control waveform of the subject smart phantom can be modeled to reflect the dynamic characteristics according to the research in the literature. Duty cycle control can also be done through the waveforms sent to the phantom. For example, the on-off duration can be from 50%–50% to 10%–90%.

In a specific embodiment of the subject phantom, physiological "noise", i.e., cardiac, respiratory, and brain (for example around 0.1 Hz) "noise" can be modeled and simulated.

Validation of the Subject Smart Phantom

The desired "answer" in blood oxygenation level dependent (BOLD) fMRI is delineation of an enhancement region with the best confidence. The subject phantom can serve as a local signal enhancement model.

The following process can be used in accordance with the subject invention. A reciprocal view of the coil and phantom can be taken, so that a given coil can be assumed to be driven. The field produced by the MR coil can be assumed constant over the secondary coils (in the phantom) surface area. An EMF can be calculated in the secondary coil. As an example, a simple loop can be used. This induced voltage is 90 degrees out of phase with the source field (coil current). The impedance of the secondary coil can be adjustable to limit the current. In a specific embodiment, the secondary coil impedance can be primarily real, such that the induced current will be 90 degrees out of phase with the source current. Therefore, the net field is the vector sum of $B_M$ and $B_2$, where $B_M = \mu_o M$, where M is the rotating component of the magnetization of the sample at detection and $\mu_o$ is the magnetic permeability of free space, and $B_2$ is the induced field. It should be noted that although the analysis described is performed using a reciprocal approach, the secondary loop, or RF coil, is preferably deactivated during transmit such that the enhancement of field described applies to the receive phase only. This enables a linear approach of field and sensitivity. Preferably, the RF coils impedence is increased to a high enough value that negligible current flows during the transmit of the excitation magnetic field $B_1$, where the excitation field $B_1$ is turned on and off. When the excitation field is off, the impedance of the RF coil(s) can be lowered such that current can flow and stimulated data can be measured. The impedance of the RF coil(s) can be adjusted in a time dependent manner, in order to, for example, model physiological processes.

Circuit Schematic and Impedance Control

Figure 4A:
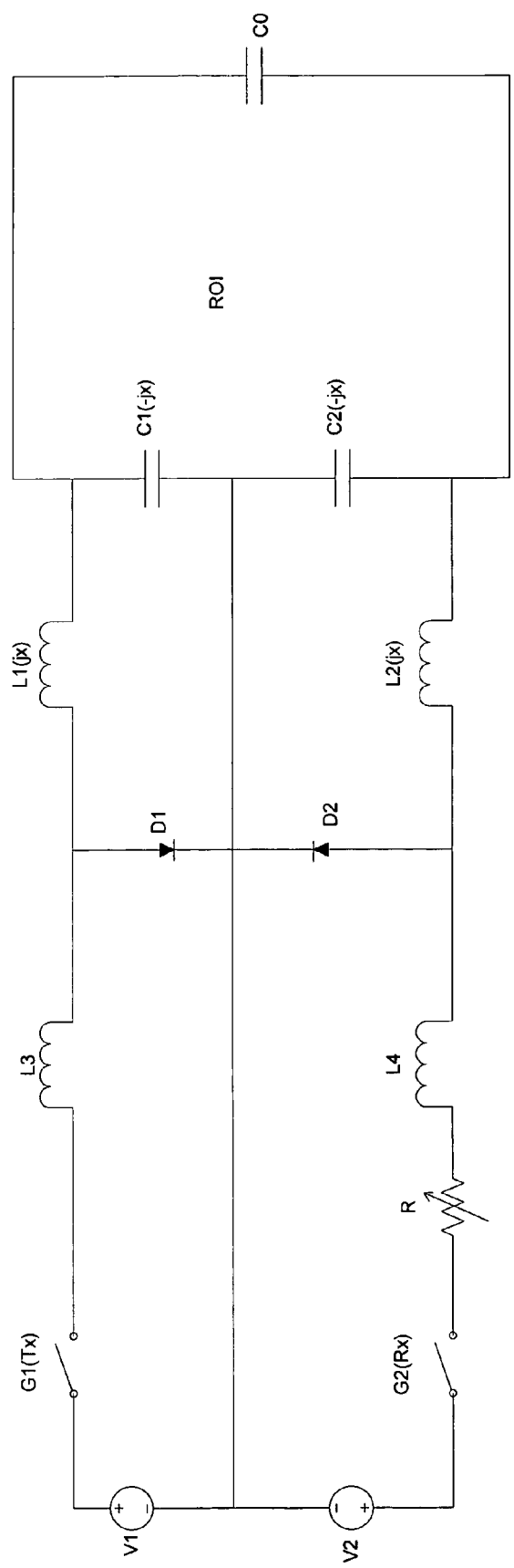
FIG. 4A shows a circuit schematic in accordance with a specific embodiment of a coil and circuitry for incorporation with a phantom.
Figure 4B:
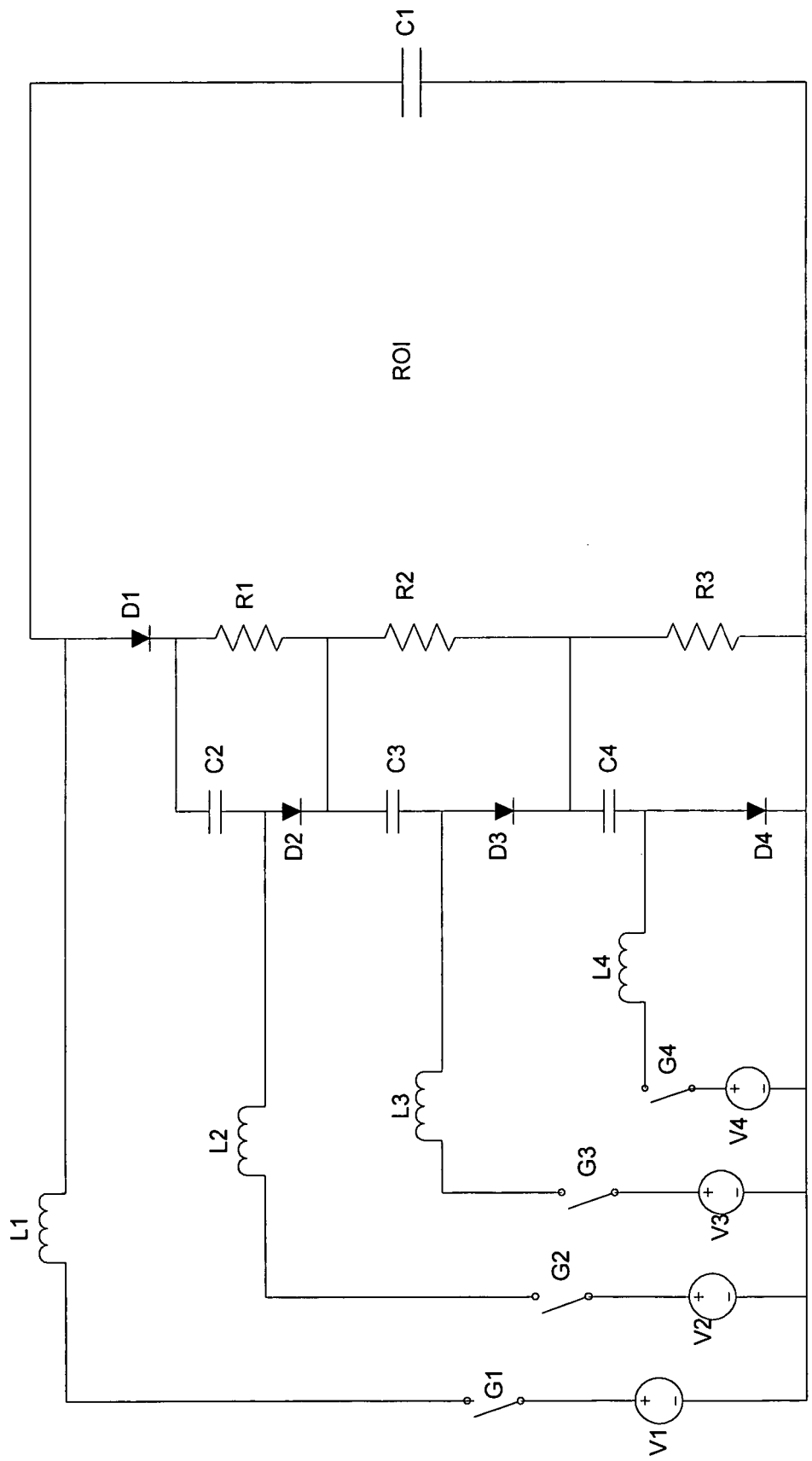
FIG. 4B shows a circuit schematic in accordance with a specific embodiment of a coil and circuitry for incorporation with a phantom.

Circuit schematics with respect to a specific embodiment of the subject invention are shown in FIGS. 4A and 4B. Each circuit has a conductor loop, and other components that are used to adjust the loop's impedance. The loop is tuned to the Larmor frequency of the magnet with a tuning capacitor, such as $C_0$ or $C_1$. The area covered by the loop determines the Region of Interest (ROI), where signal enhancement can be detected by a receive coil, such as a head coil. The signal enhancement is caused by current induced from the sample magnetization during the receive phase.

MRI signals come from the magnetization of nuclei spins of the sample material. The rotation of the magnetization, after excitation of the sample material, induces current in the RF coil. This current in the RF coil produces an induced magnetic field $B_2$ in the region of interest. This time-varying magnetic field $B_2$ penetrates the receive, or detection, coil, and generates additional signal in the detector (receive coil) in superposition to the signal from spin magnetization. In the 'off' state, where the RF coil is decoupled, only $B_M$ induce voltages in the receive coil, resulting in $V_M$. In the 'on' state, $B_{net}$, instead of $B_M$, will induce voltages in the receive coil, resulting in $V_{net}$. Then we can define the enhancement level as:

$$\text{enhancement} = \frac{V_{net} - V_M}{V_M}. \quad (5)$$

By adjusting the impedance of the loop, which will be pure resistance when resonant, one can change the induced current, which is a ratio of the induced voltage over impedance. The induced current determines the secondary, or induced, field $B_2$ and, therefore, the level of enhancement, where the enhancement level is defined as $$\frac{V_{net} - V_M}{V_M}.$$

FIG. 4A shows an embodiment of a coil and accompanying circuitry implementing impedance control using two LC resonance traps, in accordance with the subject invention. Each trap includes an inductor, a capacitor, and a pin diode. The pin diode is a non-linear component, such that its forward resistance is a function of bias current. The upper trap, including inductor $L_1$ and capacitor $C_1$, which are tuned to resonate at the Larmor frequency of the magnet, and diode $D_1$, produces high impedance during transmit so as to de-couple the resonance loop during transmit. The lower trap, including the inductor $L_2$ and capacitor $C_2$, which are tuned to resonate at the Larmor frequency of the magnet, and diode $D_2$, produces adjustable impedance during receive. By adjusting the bias current fed to diode $D_2$ through an adjustable resistor R, one can change forward resistance of diode $D_2$, denoted as r. Therefore, the impedance $Z_r$ across capacitor $C_2$ is $$Z_r = \frac{X_c^2}{r} \quad (6)$$

where $X_c$ is the reactance of capacitor $C_2$. Consequently the induced current as well as the enhancement is changed. Inductors $L_3$, $L_4$ can function as RF chokes.

FIG. 4B shows another embodiment of a coil and accompanying circuitry implementing impedance control using a resistor array, composed of resistors $R_1$, $R_2$ and $R_3$, in accordance with the subject invention. Each resistor is in parallel with a corresponding diode and a corresponding dc-blocking capacitor such that resistor $R_1$ is in parallel with diode $D_2$ and capacitor $C_2$, resistor $R_2$ is in parallel with diode $D_3$ and capacitor $C_3$, and resistor $R_3$ is in parallel with diode $D_4$ and capacitor $C_4$. Therefore, each resistor can be involved into the resonant loop if the corresponding diode is off, and not involved in the resonant loop if the corresponding diode is on. Diode $D_1$ is reverse-biased during transmit to de-couple the resonance loop. Inductors $L_1$ through $L_4$ can function as RF chokes.

Control of Loop Impedance

This section describes how to control the impedance of the resonance loop in order to acquire different levels of enhancement. Referring to FIG. 4A, the impedance of the resonance loop can be controlled by using, for example, a resonance trap or a resistor array. Both of these techniques can incorporate pin diodes that can be biased to control the impedance of the loop. Therefore, by adjusting the biasing current, one can control the impedance of the loop. In the following, two specific implementation methods in accordance with the subject invention, that determine how to send a biasing current so as to control the impedance of the loop, are shown.

1. Control Implementation of Resistor Array

Figure 5:
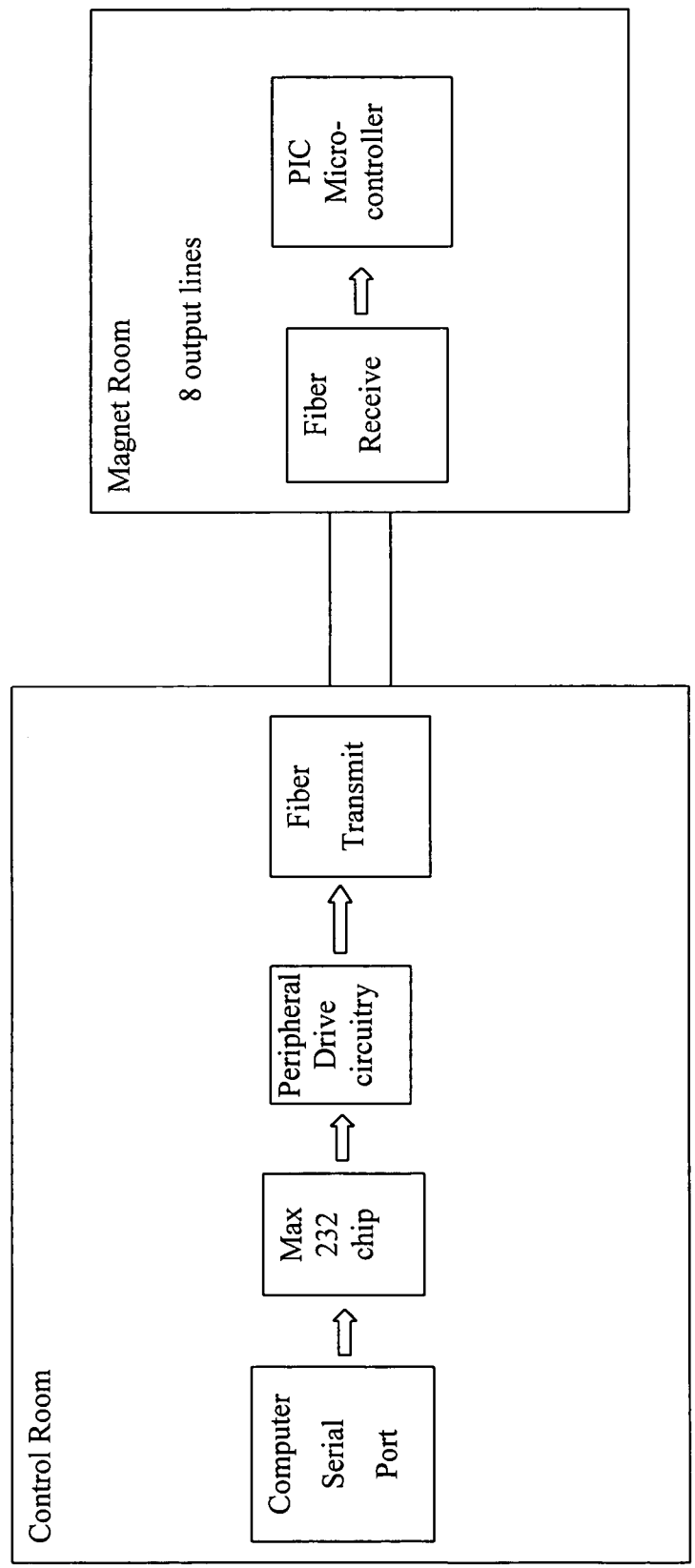
FIG. 5 shows an embodiment of an implementation incorporating the subject phantom in accordance with the subject invention.

In a specific embodiment, a personal computer (PC)'s serial port/RS232 can be used to send a digital data stream to the subject phantom, as shown in FIG. 5. The data stream includes 1's and 0's, where, for example, a 1 can turn on a diode in the circuitry of the embodiment shown in FIG. 4B so as to bypass the parallel resistor in the loop and a 0 can turn off a diode in the circuitry of the embodiment shown in FIG. 4B such that the parallel resistor is part of the loop impedance.

2. Control Implementation of High Impedance Trap

In another specific embodiment, a PC's parallel port, for example, a sound card, can be used to send a continuous analog signal to the subject phantom. The analog signal can provide a continuous current that biases the diode shown in the embodiment shown in FIG. 4A, which, consequently, controls the impedance of the loop.

Susceptibility Issues in Smart Phantom

Inhomogeneous B-Field and EPI Consideration

The subject phantom can be utilized with fMRI informatics. EPI imaging is used intensively in fMRI. EPI images are very sensitive to susceptibility, which can be interpreted as two effects. The first effect is in-plane displacement and distortion caused by off-resonance in the image plane. The second effect is signal dropout due to field in-homogeneity perpendicular to the image plane. In an embodiment, the subject phantom can be designed as a cylinder with gel inside. The field distortion can occur in both transverse direction and longitudinal direction. The size of the phantom can be determined to optimize the EPI image.

In the following, the theoretical issue will be addressed first. If we write $$H = -\nabla \Psi, \quad (7)$$

where H is magnetic field intensity and $\Psi$ is scalar magnetic potential.

Then, $$\nabla^2 \Psi = -\frac{\rho_m}{\mu_0}, \quad (8)$$

where $\rho_m$ is magnetic charge density and $\mu_0$ is permeability of free space, where $$\rho_m = -\nabla \cdot (\mu_0 \vec{M}) = -\nabla \cdot \left(\frac{\chi}{1+\chi} B\right) = -\frac{\mu_0^2}{\mu} \vec{H} \cdot \nabla \chi \quad (9)$$

where $\overline{M}$ is magnetization, $\chi$ is susceptibility, $\mu$ is permeability of the material, and B is magnetic field flux density.

For a cylinder in another media, $\chi$ is constant except at the border, so we obtain at point (r, θ, z), in cylindrical coordinates, $$\Psi = \frac{\mu_0}{4\pi\mu} \int_S \frac{H_0 \Delta\chi \cdot \rho}{\sqrt{r^2 + \rho^2 - 2r\rho\cos(\theta-\phi) + z^2}} d\rho d\phi \quad (10)$$

where S represents the surface of the top and bottom, ρ is an integral variable for radius, φ is an integral variable for angle, and $H_0$ is the external magnetic field intensity.

The z component of H is $$H_z = -\frac{\partial \Psi}{\partial z} \quad (11)$$
$$= \frac{\mu_0}{4\pi\mu} \int_S \frac{z H_0 \Delta\chi \cdot \rho}{\left(\sqrt{r^2 + \rho^2 - 2r\rho\cos(\theta-\phi) + z^2}\right)^3} d\rho d\phi$$

In this equation θ can be set to zero due to symmetry. Then, $$H_z = -\frac{\partial \Psi}{\partial z} \quad (12)$$
$$= \frac{\mu_0}{4\pi\mu} \int_s \frac{z H_0 \Delta\chi \cdot \rho}{\left(\sqrt{r^2 + \rho^2 - 2r\rho\cos\phi + z^2}\right)^3} d\rho d\phi$$

Simulation

Figure 6B:
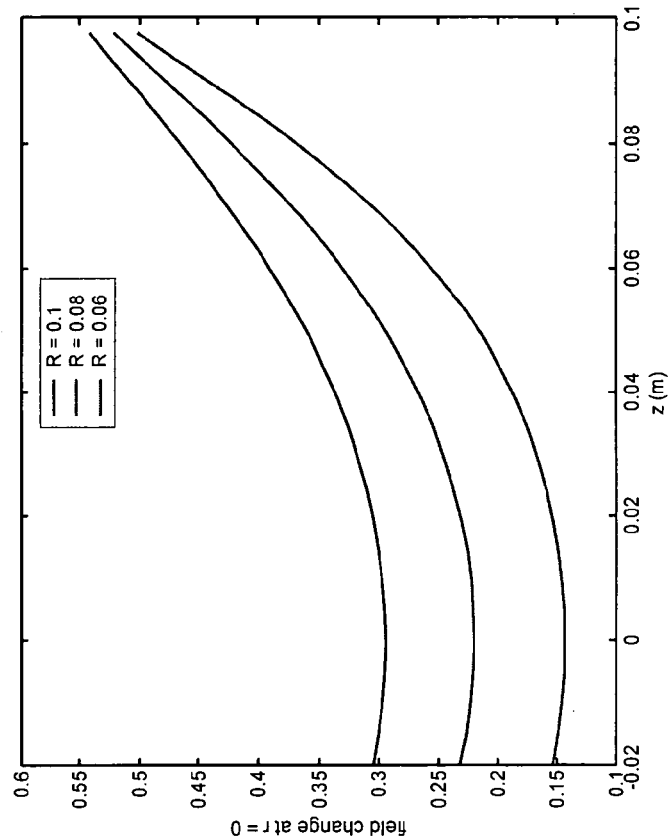
FIGS. 6A and 6B show field distortions in the radial and longitudinal directions, respectively, for a simulation of a cylindrical phantom of fixed length in the z direction.
Figure 6A:
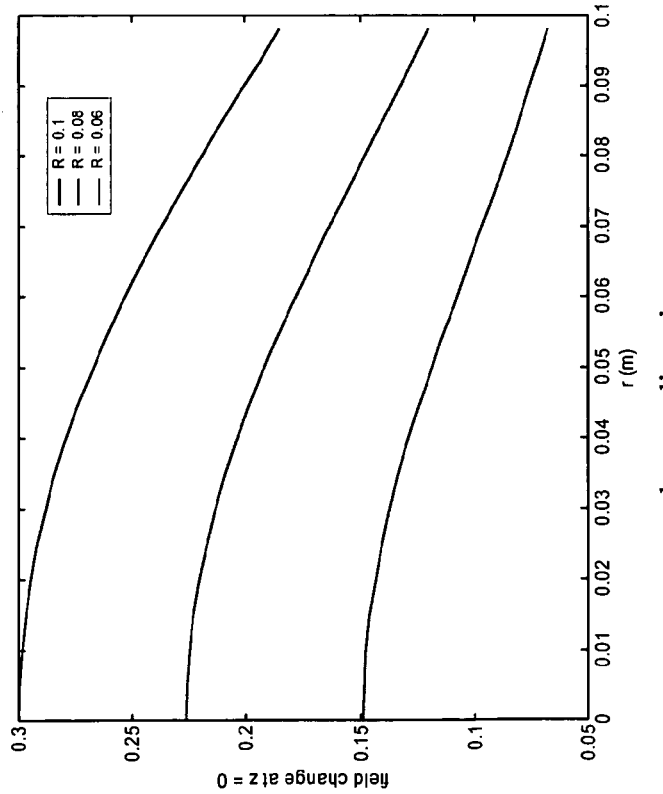

A simulation has been performed for a cylindrical phantom of fixed length, L=20 cm, in z direction. The radius was set to 6 cm, 8 cm, and 10 cm. These radii are consistent with practical situations. FIGS. 6A and 6B show the field distortions in the radial and longitudinal directions, respectively, for radii of 6 cm, 8 cm, and 10 cm. Referring to FIGS. 6A and 6B, for a fixed length cylinder, longitudinal inhomogeneity decreases with radius while transverse inhomogeneity increases with radius. Therefore, there is essentially a tradeoff between the two susceptibility effects. Moving the curves to the same starting point, within the vicinity of z=0 and r=0, the field inhomogeneity is essentially the same. The biggest change happens near the edge of phantom. Since the slices are chosen to be close to the center, it may be preferable to use a 6 cm radius phantom. FIGS. 6A and 6B show field distortions in the radial and longitudinal directions, respectively, for a simulation of a cylindrical phantom of fixed length in the z direction.

Figure 7B:
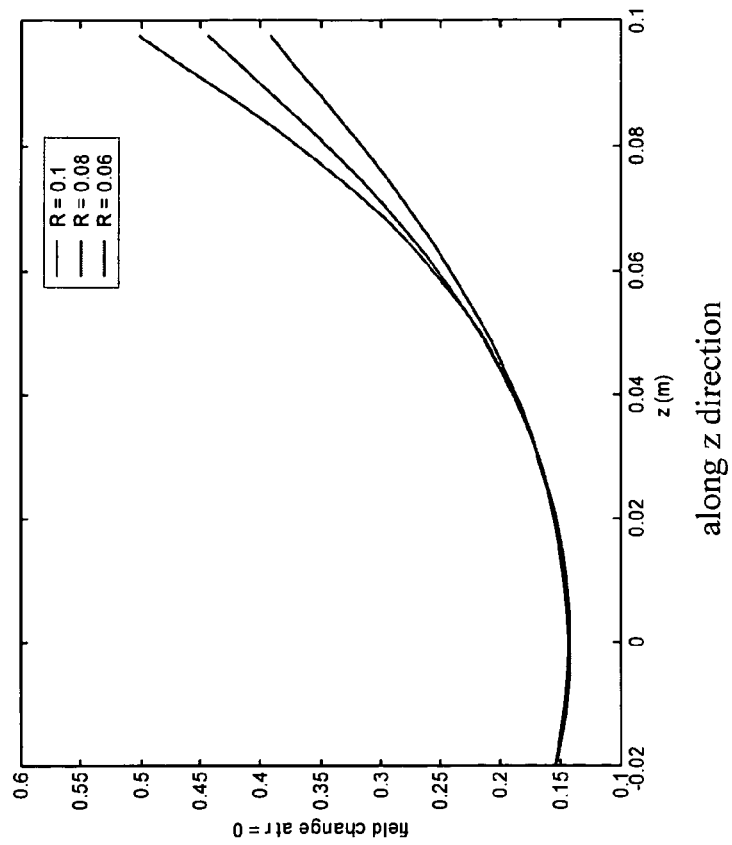
FIGS. 7A and 7B show a comparison of the field distortions for three radius by moving the curves in FIGS. 6A and 6B, respectively, to coincide at r=0 or z=0.
Figure 7A:
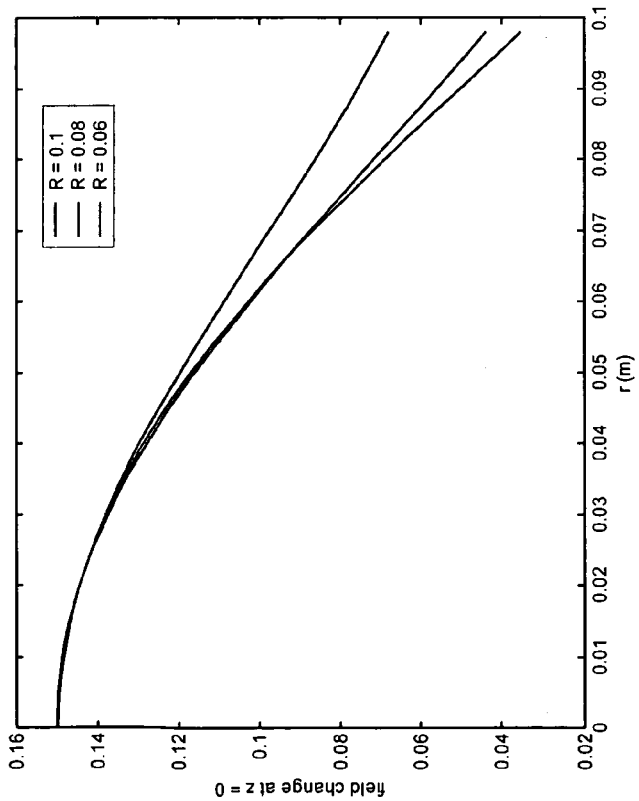

FIGS. 7A and 7B show a comparison of the field distortions for three radius by moving the curves in FIGS. 6A and 6B, respectively, to coincide at r=0 or z=0.

With this design, high quality EPI images can be obtained.

Figure 8B:
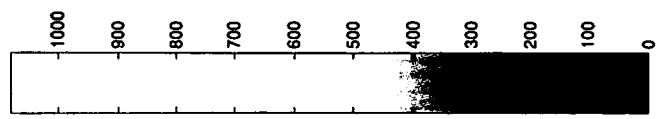
FIGS. 8A and 8B show an EPI (SLT=5 mm, TE=54, FOV=160 mm) image and a Spin-echo image (same slice, TR/TE=552/16) of a specific embodiment of the subject smart phantom acquired in a Siemens Symphony system.
Figure 8B:
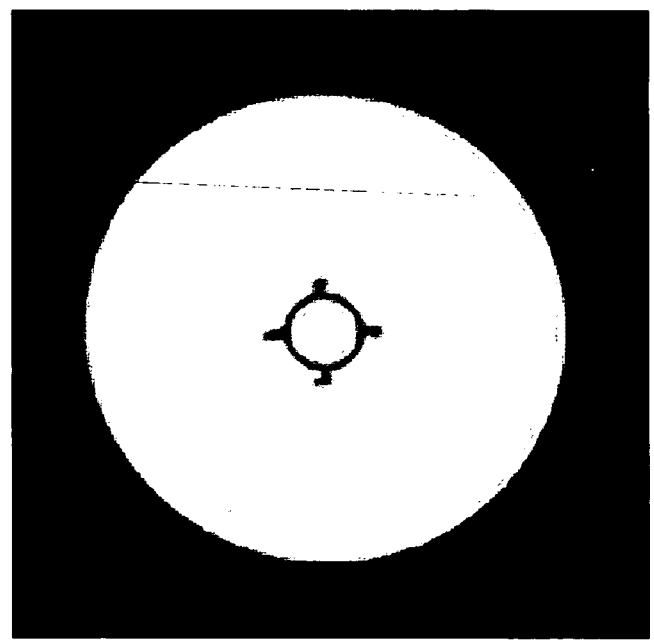
Figure 8A:
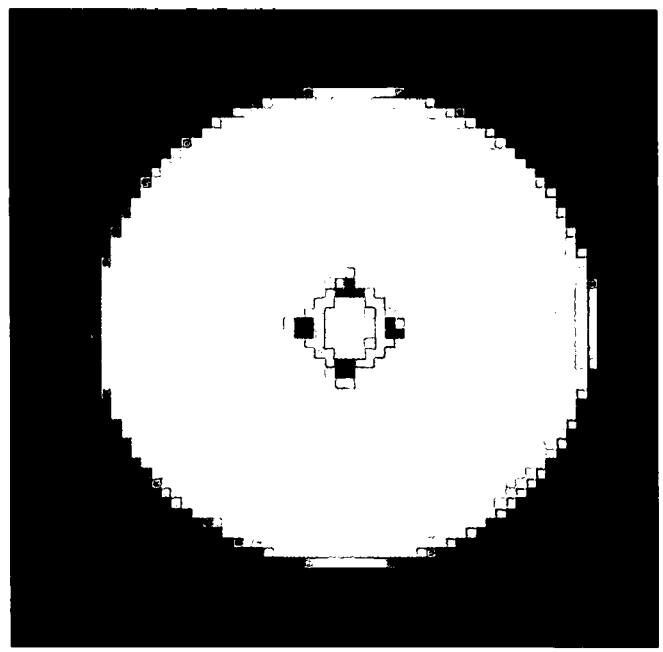

FIGS. 8A and 8B show an EPI (SLT=5 mm, TE=54, FOV=160 mm) image and a Spin-echo image (same slice, TR/TE=552/16) of a specific embodiment of the subject smart phantom acquired in a Siemens Symphony system.

Gel Preparation

In an embodiment, the subject phantom can be filled partially, or completely, with a gel. Preferably, the gel in the phantom is chosen to model tissue to be imaged in the imaging system.

Some gels have bubbles, which can cause severe distortions of the EPI image. In a specific embodiment, agarose gel can be used, due to the uniformity and stability of the agarose gel. The T1 and T2 of agarose gel can be controlled by adjusting the concentration of agarose and copper sulfate, where T1 is longitudinal relaxation time and T2 is transverse relaxation time. Measurements of the T1 and T2 of agarose gel under different concentrations of agarose and copper sulfate, respectively, were made. These measurements show that the inverse of T1 and the inverse of T2 are proportional to the concentration of agarose (in pecentage) and the concentration of copper sulfate (in mM). In an embodiment of the subject invention, the following equations can be used to model such relationships $$\frac{1}{T_2} = 9.0 \times 10^{-3} \; [agarose \; \%] + 2.10 \times 10^{-3} \; [CuSO_4] + 0.97 \times 10^{-3} \quad (13)$$

$$\frac{1}{T_1} = 1.51 \times 10^{-4} \; [agarose \; \%] + 9.433 \times 10^{-4} \; [CuSO_4] + 8.7 \times 10^{-5} \quad (14)$$

To obtain a gel with a T1/T2 ratio in the range of a brain, for example, $[CuSO_4]$=0.75 mM and [Agarose]=1.2% can be chosen.

Simulation of Respiratory Artifacts

The effect of respiration on fMRI imaging is usually considered as susceptibility changes due to breathing. According to Schenck (Schenck, J. The role of magnetic susceptibility in magnetic resonance imaging: MRI magnetic compatibility of the first and second kinds. *Med. Phys.* 23 815–50, 1996), a spherical cavity induces a magnetic dipole field which is given by $$\Delta B(x, y, z) = \frac{\frac{1}{3}\Delta\chi B_0 R^3 (2z^2 - x^2 - y^2)}{(x^2 + y^2 + z^2)^{5/2}} \quad (15)$$

where R is the radius of the cavity, χ is susceptibility, and $B_0$ is the external magnetic field. This additional field change can be generated by a small loop perpendicular to the magnetic field placed at the same position.

$$B_z(x, y, z) = \frac{I\pi a^2}{c} \frac{(2z^2 - x^2 - y^2)}{(x^2 + y^2 + z^2)^{5/2}} \text{ for } z \gg a, \quad (16)$$

where a is the radius of the loop, I is the current flowing in the small loop, and c is the speed of light. This field is very small compared to $B_0$, therefore, it can be assume that the transverse field will not affect the spins at all. However, we do not want to place the loop far away from the phantom, such that the field distortion becomes slightly different. The above equation can be rewritten as $$B_z(x, y, z) = \frac{I\pi a^2}{c} \frac{(2z^2 - r^2)}{(r^2 + z^2)^{5/2}} \quad (17)$$

where r is the distance between the imaged pixel and the center of the imaging slice. It is known that the susceptibility has two in-plane effects. One effect is shift of the whole image and another effect is distortion of the image. The shift of the whole image is due to the field difference to $B_0$, the distortion is due to the field difference within the subject. In an embodiment of the subject phantom, z is about 10 cm, while for a human body, z is about 35 cm. The induced field change is computed from the above equation (18) for r up to 5 cm. The results are shown in FIGS. 9A and 9B.

Figure 9B:
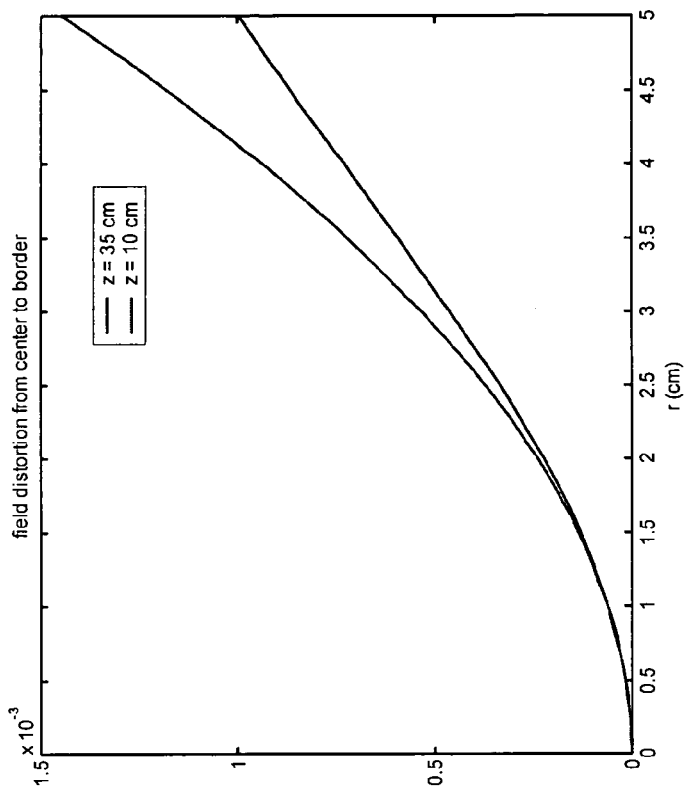
FIGS. 9A and 9B show the field distortion for z=10 cm and z=35 cm, normalized at r=0 and the field distortion for z=10 cm and z=35 cm, scaled to make the overall change from r=0 to r=5 close to each other, respectively.
Figure 9A:
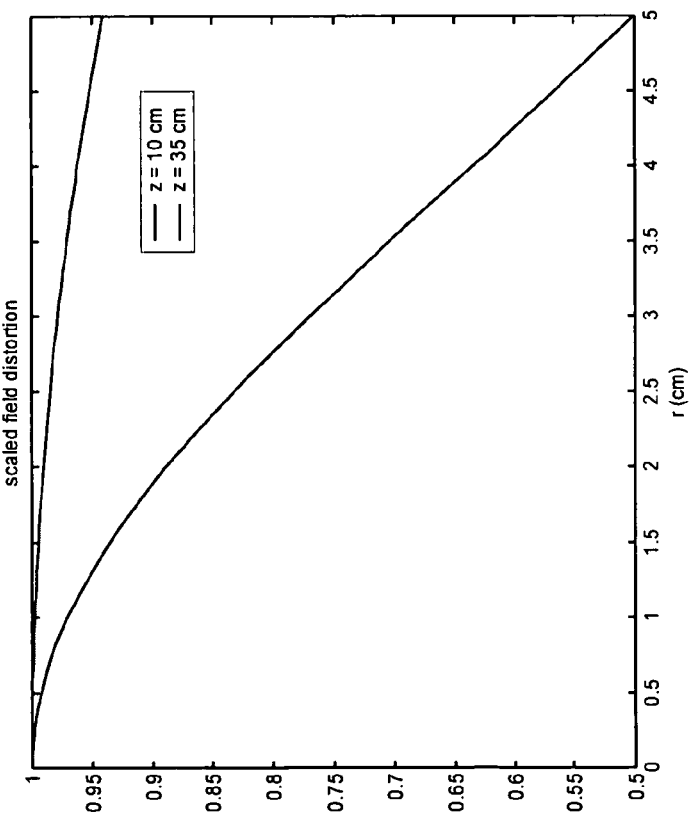

FIGS. 9A and 9B show the field distortion for z=10 cm and z=35 cm, normalized at r=0 and the field distortion for z=10 cm and z=35 cm, scaled to make the overall change from r=0 to r=5 close to each other, respectively.

Referring to FIGS. 9A and 9B, both shift and distortion of the image cannot be simulated simultaneously. However, the shift of the image can be corrected by motion correction, such that this effect is not critical. In an embodiment, the respiratory effect can be simulated reasonably well by regulating the current in the additional loop of the subject phantom in a rhythm consistent with breathing.

In an embodiment, the gradient field can induce emf in this loop, and $$emf = \frac{d\Phi}{dt} \sim \frac{\Delta B}{\Delta t} S_{loop}. \quad (18)$$

However, for an EPI image, the effect of the gradient field can be neglected because the z-gradient only happens once for each slice and it typically only affects the first few lines of k-space.

Figure 10B:
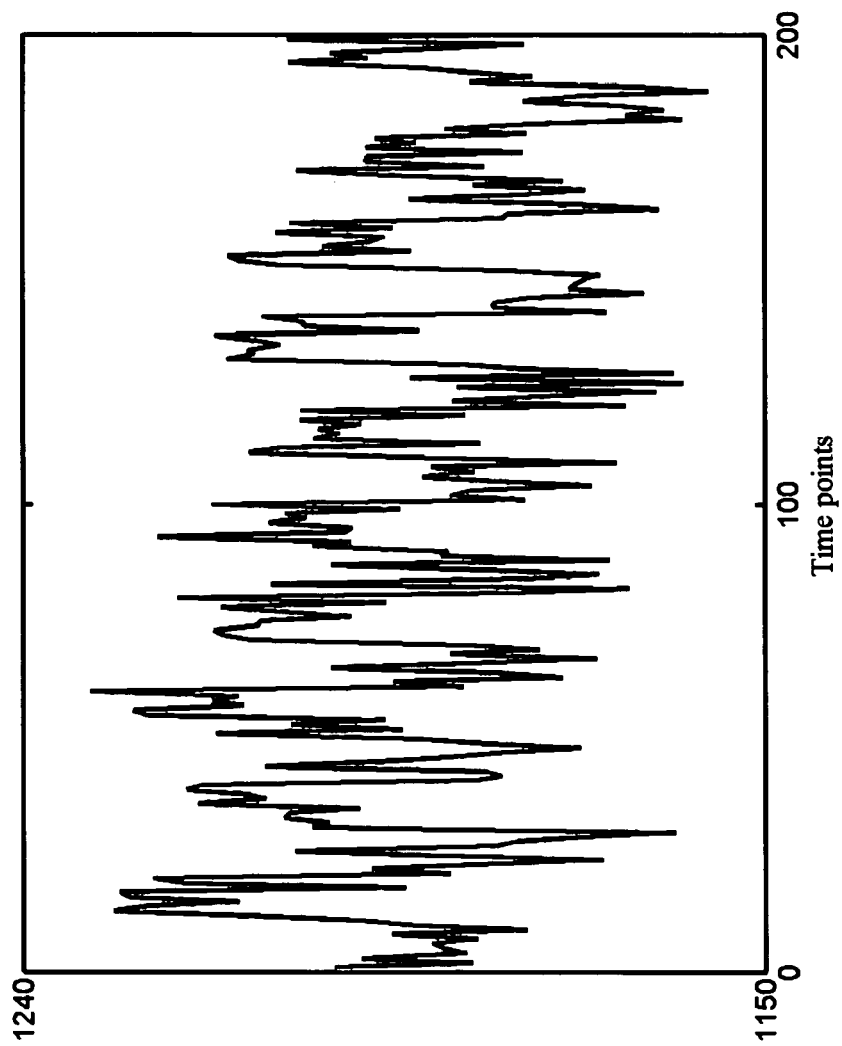
FIGS. 10A and 10B show an EPI image of an axial slice of an embodiment of a phantom in accordance with the subject invention and the BOLD-similar time course of the mean signal in the ROI with SNR=73, respectively.
Figure 10A:
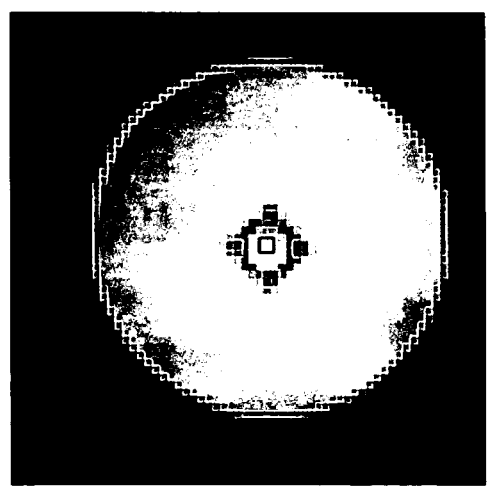

An embodiment of the subject smart phantom has been used to simulate a Blood Oxygenation Level Dependent (BOLD) signal in a real scan. In this scan, 205 single-slice gradient echo EPI images were acquired in a GE 1.5 T Signa scanner with a 4-channel phased array head coil (MRI Devices Corporation, Waukesha, Wis., USA). The field of view (FOV)=16 cm, the Repetition Time (TR)=3 s and the Echo Time (TE)=31 ms. The image Matrix=64×64, and the Slice Thickness (SLT)=3 mm. The first 5 images were discarded. The remaining images follow the paradigm of alternative off-on states, each of which lasts 30 s. The enhancement level of the phantom was set to 2%. The exams were repeated 3 times to get different signal-to-noise (SNR) ratios with Flip Angle (FA) equal to 90°, 30°, and 12°. FIG. 10A is an EPI image of an axial slice of the subject phantom. The spin-like signal enhancement is supposed to be localized to the center of the circle and uniform in this region. Therefore, all the analyses are chosen to be constrained on the 9-pixel square region of interest (ROI). FIG. 10B shows the BOLD-similar time course of the mean signal in the ROI for two enhancement levels. Besides signal variation from one time point to another, slight signal drift is also observed in the 10 minutes scan.

Design Scheme II

Figure 11:
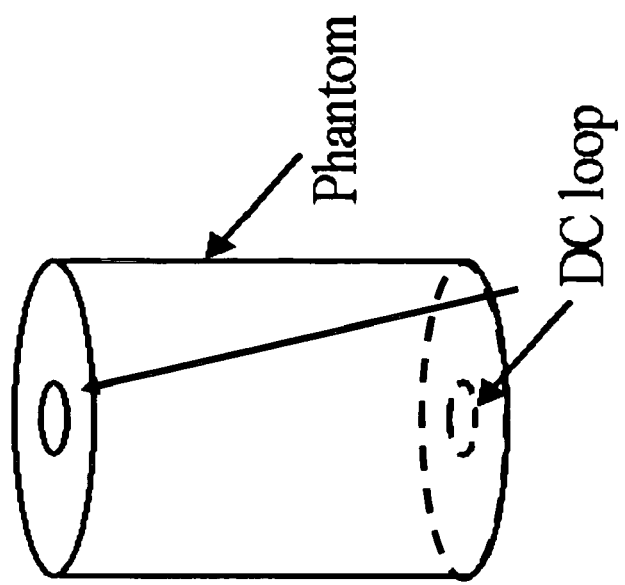
FIG. 11 shows an embodiment of the subject phantom having a cylindrical shape and having a loop attached to each end of the phantom such that the axis of the cylinder intersects the centers of the two loops.

In a specific embodiment, a coil loop can be positioned perpendicular to the magnetic field $B_0$, such that DC current inported into the loop will produce field distortion to $B_0$, where the distortion decays with distance from the loop. In other embodiments, one or more coils associated with a magnetic field having a component parallel with static field $B_o$ can be utilized. The coil(s) can be positioned above, below, and/or within the sample material. The incorporation of coil(s) providing fields in the $B_o$ direction can be in conjunction with the use of RF coils as described associated with magnetic fields perpendicular to $B_o$, or can be used without such RF coils. The field distortion can affect the image in two ways. The field distortion can cause a global shift of the image due to $B_0$ offset. The field distortion can also cause signal loss due to the gradient of field distortion in $B_0$ direction, which can be used for simulating BOLD effect. The global shift can be compensated for both active and basal states in BOLD imaging by, for example, using a phantom of cylinder shape with a loop attached to each end, where the axis of the cylinder intersects with the centers of the two loops. FIG. 11 shows an embodiment of the subject phantom having a cylindrical shape and having a loop attached to each end of the phantom such that the axis of the cylinder intersects the centers of the two loops. In a specific embodiment, a plurality of DC coil loops can be positioned and provided with current to produce a substantially constant B-field over the region of interest.

Referring to FIG. 11, a DC current can be input to one or both of the end loops to induce local field distortion, which simulates susceptibility effect as BOLD. Diodes can be used to control on and off states. In an embodiment, the 'on' state can be such that both loops have currents and the 'off' state can be such that only one loop has current, but of 2 times magnitude. The field of the 'off' state in this embodiment is more inhomogeneous in z direction than the field of the 'on' state, but the offsets of the z component of the magnetic field are almost the same. The embodiment shown in FIG. 11 can be operated in a mode that is T2-dependent. In theory, the coupling between the end loops and receiver coils is small and, therefore, it should not introduce much noise, which is verified by experiments.

Figure 12:
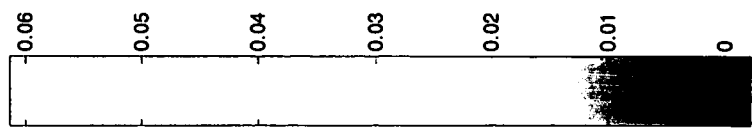
FIG. 12 shows a difference image from an 'on' state and and 'off' state for a specific embodiment of the subject invention.
Figure 12:
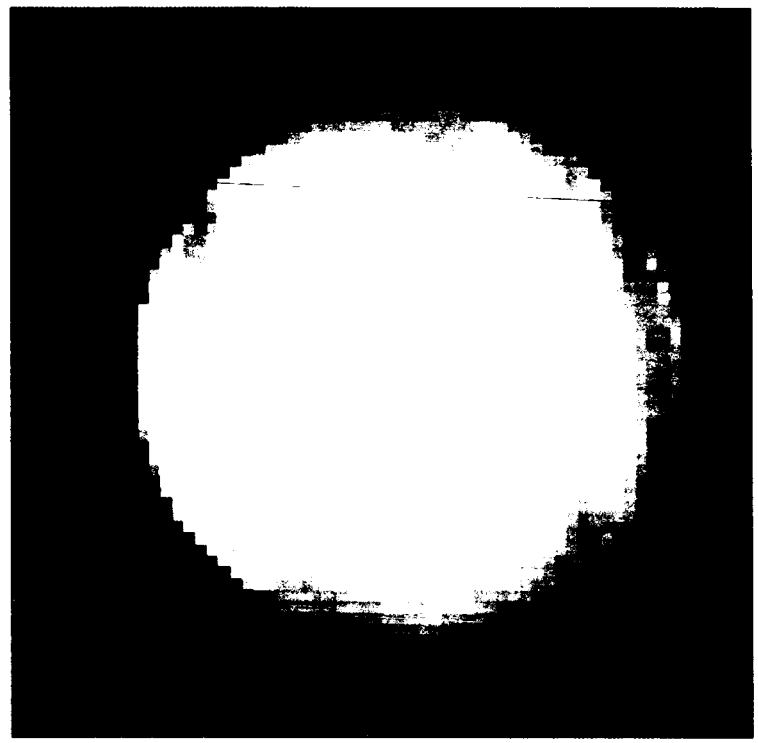

Referring to the embodiments shown in FIG. 11, two solenoids (10-turn loops, 2 cm in diameter) were put on the ends of a phantom in accordance with the subject invention, with the axes of the end loops along $B_0$ direction. For the 'on' state, 300 mA current was driven to both solenoids, and 60 images were acquired. For the 'off' state, 600 mA current was driven to only one solenoid, and 60 images were acquired. FIG. 12 shows a difference image from the 'on' state (with current in both loops) to the 'off' (with two times current in only one loop), after averaging. In FIG. 12, the center of mass shifts upward due to field superposition. If we change the direction of the current, this effect can be, at least, partially corrected.

Other embodiments utilizing one or more coils as shown in FIG. 11 can drive the coils with a time varying current, in order to model time-varying activities. In a specific embodiment, the coil(s) can be driven by a time-varying current that models breathing.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A method for producing simulated fMRI data, comprising:
   locating an RF coil in a static magnetic field $B_o$, wherein the RF coil is associated with an RF magnetic field such that the RF magnetic field has a component that is perpendicular to the static magnetic field $B_o$ in a region of interest;
   locating a sample material in a region of interest in the static magnetic field $B_o$ such that the RF coil is proximate to the sample material;
   exciting the sample material with an excitation RF magnetic field $B_1$, which has a component perpendicular to the static magnetic field $B_o$, such that the magnetization M of the sample material rotates;

detecting a net RF magnetic field $B_{net}$ in the region of interest after exciting the sample material with the excitation RF magnetic field $B_1$, wherein the rotation of the magnetization M of the sample material induces a voltage V in the RF coil, wherein the voltage induced in the RF coil produces a current I, where $$I = \frac{V}{Z},$$

where Z is the impedance of the RF coil, wherein the current I produces an induced RF magnetic field $B_2$, wherein the induced RF magnetic field $B_2$ alters the net RF magnetic field $B_{net}$ proximate to the RF coil, wherein the net RF magnetic field $B_{net}$ after exciting the sample material with the excitation RF magnetic field $B_1$ is the vector sum of the magnetic field $B_M$ of the rotating magnetization M, where $B_M = \mu_o M$ and $\mu_o$ is the magnetic permeability of free space, and the induced RF magnetic field $B_2$, wherein a first portion of an MRI signal is produced for the region of interest;

exciting the sample material with the excitation RF magnetic field $B_1$, which has a component perpendicular to the static magnetic field $B_o$, such that the magnetization M of the sample material rotates;

detecting the net RF magnetic field $B_{net}$ in the region of interest after exciting the sample material with the excitation RF magnetic field $B_1$ and while the RF coil is decoupled, wherein the net RF magnetic field $B_{net}$ after exciting the sample material with the excitation RF magnetic field B1 and while the RF coil is decoupled is the magnetic field $B_M$ of the rotating magnetization M, wherein a second portion of an MRI signal is produced for the region of interest; and producing simulated fMRI data for the region of interest from the first portion of the MRI signal and the second portion of the MRI signal.

2. The method according to claim 1, wherein the excitation RF magnetic field $B_1$ is perpendicular to the static magnetic field $B_o$.

3. The method according to claim 1, further comprising: decoupling the RF coil during exciting the sample material with an excitation RF magnetic field $B_1$.

4. The method according to claim 1, wherein exciting the sample material with the excitation RF magnetic field $B_1$ comprises exciting the sample material with the excitation RF magnetic field $B_1$ via an MR scanner and detecting the net RF magnetic field in the region of interest comprises detecting the net RF magnetic field in the region of interest via the MR scanner.

5. The method according to claim 4, wherein exciting the sample material with an excitation RF magnetic field $B_1$ via an MR scanner comprises applying a plurality of excitation RF magnetic field $B_1$ pulses.

6. The method according to claim 1, wherein the RF coil is rectangular.

7. The method according to claim 1, wherein the RF coil is sufficiently proximate to the sample material that excitation of the sample material produces a positive enhancement level in at least a portion of the region of interest.

8. The method according to claim 7, wherein the enhancement level is defined as $$\frac{V_{net} - V_M}{V_M}$$

where $V_{net}$ is the voltage produced in a receive coil during detecting the net RF magnetic field $B_{net}$ when $B_{net}$ is the vector sum of $B_M$ and $B_2$, where $V_M$ is voltage produced in a receive coil during detecting the net RF magnetic field $B_{net}$ while the RF coil is decoupled and $B_{net}$ is BM.

9. The method according to claim 1, wherein the RF coil is sufficiently proximate to the sample material that excitation of the sample material produces a negative enhancement level in at least a portion of the region of interest.

10. The method according to claim 9, wherein the enhancement level is defined as $$\frac{V_{net} - V_M}{V_M}$$

where $V_{net}$ is the voltage produced in a receive coil during detecting the net RF magnetic field $B_{net}$ when $B_{net}$ is the vector sum of $B_M$ and $B_2$, where $V_M$ is voltage produced in a receive coil during detecting the net RF magnetic field $B_{net}$ while the RF coil is decoupled and $B_{net}$ is BM.

11. The method according to claim 1, wherein the RF coil is sufficiently proximate to the sample material that excitation of the sample material can produce an enhancement level of at least 0.25% in at least a portion of the region of interest.

12. The method according to claim 11, wherein the RF coil is sufficiently proximate to the sample material that excitation of the sample material produce an enhancement level of between about 1% and about 10% in at least a portion of the region of interest.

13. The method according to claim 1, wherein the impedance of the RF coil is approximately real.

14. The method according to claim 1, further comprising:
locating a second RF coil in the static magnetic field $B_o$, wherein the second RF coil is associated with a second RF magnetic field such that the second RF magnetic field has a component that is perpendicular to the static magnetic field $B_o$, wherein the second RF coil is proximate the sample; and decoupling the second RF coil during detecting the net RF magnetic field $B_{net}$ in the region of interest after exciting the sample material with the excitation RF magnetic field B1 and while the RF coil is decoupled, wherein after exciting the sample material with an excitation RF magnetic field $B_1$ the rotation of the magnetization M of the sample material induces a second voltage $V_2$ in the second RF coil, wherein the second voltage induced in the second RF coil produces a second current $I_2$, where $$I_2 = \frac{V_2}{Z_2},$$

where $Z_2$ is the impedance of the second RF coil, wherein the second current produces a second induced RF magnetic field $B_3$, wherein the second induced RF magnetic field $B_3$ alters the net RF magnetic field $B_{net}$ proximate to the second RF coil, wherein the net RF magnetic field $B_{net}$ after exciting the sample material with the excitation RF magnetic field $B_1$ is the vector sum of the magnetic field $B_M$ of the rotating magnetization M, the induced RF magnetic field $B_2$, and the second induced RF magnetic field $B_3$, wherein the second portion of the MRI signal produced for the region of interest includes the effect of the second induced RF magnetic field $B_3$.

15. The method according to claim 14, wherein the RF coil and the second RF coil form a quadrature coil.

16. The method according to claim 15, wherein the second RF coil is orientated at angle with respect to the RF coil with respect to a plane perpendicular to the static magnetic field $B_o$.

17. The method according to claim 16, wherein the second RF coil is orientated at an angle of about 90° with respect to the RF coil with respect to the plane perpendicular to the static magnetic field $B_o$.

18. The method according to claim 16, wherein the RF coil and the second RF coil are both substantially planar, wherein a container having the sample material inside is positioned such that at least a portion of the container is positioned to intersect the plane of the RF coil and to intersect the plane of the second RF coil.

19. The method according to claim 18, wherein the container is positioned within a cylinder formed by the RF coil and the second RF coil.

20. The method according to claim 19 wherein the container is cylindrically shaped.

21. The method according to claim 1, wherein the RF coil has a maximum length in at least one dimension of less than about 4 cm.

22. The method according to claim 1, wherein the RF coil has a maximum length in at least one dimension of less than one-third the maximum length of the sample in the same dimension.

23. The method according to claim 1, wherein the RF coil is located within the sample material.

24. The method according to claim 1, further comprising adjusting the RF coil resistance of the RF coil alter exciting the sample material with the excitation RF magnetic field $B_1$, wherein adjusting the RF coil resistance varies the enhancement level after exciting the sample material with the excitation RF magnetic field $B_1$.

25. The method according to claim 24, wherein adjusting the RF coil resistance comprises adjusting the RF coil resistance via software control.

26. The method according to claim 24, wherein the enhancement level is varied between about 1% and about 10%.

27. The method according to claim 1, wherein at least a portion of the sample material moves during detecting the net RF magnetic field $B_{net}$ in the region of interest.

28. The method according to claim 27, wherein the at least a portion of the sample material flows during detecting the net RF magnetic field $B_{net}$ in the region of interest.

29. The method according to claim 1, wherein at least one property of the sample material is adjusted during detecting the net RF magnetic field $B_{net}$ in the region of interest.

30. The method according to claim 1, wherein the RF coil is moved during detecting the net RF magnetic field $B_{net}$ in the region of interest.

31. The method according to claim 1, wherein the shape of the sample material is altered during detecting the net RF magnetic field $B_{net}$ in the region of interest.

32. The method according to claim 1, wherein the RF coil acts as a local spin magnetization amplifier.

33. The method according to claim 1, further comprising:
at least one additional coil associated with a corresponding at least one additional static magnetic field parallel to the static magnetic field $B_0$, where the at least one additional coil is located such that the corresponding at least one additional static magnetic field associated with the at least one additional coil reaches the region of interest.

34. The method according to claim 33, wherein the at least one additional coil comprises two end coils positioned parallel to each other, wherein at least a portion of the region of interest is between the two end coils.

35. The method according to claim 1, wherein exciting the sample material comprises exciting the sample material with an excitation RF magnetic field $B_1$ that includes a characteristic that models one or more physiological noises.

36. The method according to claim 1, wherein excitation of the sample material produces regions of variable MR image contrast to noise.

37. The method according to claim 1, wherein exciting the sample material comprises controlling the duty cycle of the excitation.

38. The method according to claim 37, wherein controlling the duty cycle of the excitation allows variable and fixed on periods and variable and fixed off periods.

39. The method according to claim 1, wherein exciting the sample material comprises exciting the sample material with an excitation RF magnetic field $B_1$ that includes a characteristic that models a hemo-dynamic response.

40. The method according to claim 39, wherein the hemo-dynamic response is given by $y(t)=\gamma x(t) \cdot h(t)+n(t)$ wherein "·" denoted convolution, $\gamma$ denotes the gain of the fMRI imaging process, and n(t) represents the noise.

41. The method according to claim 40, wherein h(t) is modeled as a Poisson function, where $$h(t) = \frac{\lambda^t e^{-\lambda}}{t!},$$

and $\lambda$ represents the log and dispersion.

42. The method according to claim 40, wherein h(t) is modeled as a Gaussian function, where $$h(t) = \frac{1}{\sqrt{2\pi\sigma^2}} \exp\left(-\frac{(t-\mu)^2}{\sigma^2}\right)$$

and m and s are the mean and standard deviation.

43. The method according to claim 40, wherein h(t) is modeled as a Gamma function, where $$h(t) = \frac{(t/\tau)^{n-1} e^{-t/\tau}}{\tau(n-1)!},$$

and t is time, t is a time constant, and n is a phase delay.

44. The method according to claim 1, wherein exciting the sample material comprises exciting the sample material with an excitation RF magnetic field $B_1$ that includes a characteristic that models smoothing.

45. The method according to claim 1, wherein exciting the sample material comprises exciting the sample material with an excitation RF magnetic field $B_1$ that includes a characteristic that models delay.

46. The method according to claim 1, further comprising at least one additional RF coil.

47. The method according to claim 46, wherein the sample material models a human head, wherein one of the RF coil and the at least one additional RF coil is located at a position in the sample material that approximates the location of the primary visual cortex.

48. The method according to claim 46, wherein the sample material models a human head, wherein one of the RF coil and the at least one additional RF coil is located at a position in the sample material that approximates the location of the primary motor cortex.

49. The method according to claim 46, wherein the sample material models a human head, wherein one of the RF coil and the at least one additional RF coil is located at a position in the sample material that approximates the location of the primary auditory cortex.

50. A method for producing simulated fMRI data, comprising:
locating an RF coil in a static magnetic field $B_o$, wherein the RF coil is associated with an RF magnetic field such that the RF magnetic field has a component that is perpendicular to the static magnetic field $B_o$ in a region of interest;
locating a sample material in a region of interest in the static magnetic field $B_o$ such that the RF coil is proximate to the sample material;
exciting the sample material with an excitation RF magnetic field $B_1$, which has a component perpendicular to the static magnetic field $B_o$, such that the magnetization M of the sample material rotates;
detecting a net RF magnetic field $B_{net}$ in the region of interest after exciting the sample material with the excitation RF magnetic field $B_1$, wherein the rotation of the magnetization M of the sample material induces a voltage V in the RF coil, wherein the voltage induced in the RF coil produces a current I, where $$I = \frac{V}{Z},$$

where Z is the impedance of the RF coil, wherein the current I produces an induced RF magnetic field $B_2$, wherein the induced RF magnetic field $B_2$ alters the net RF magnetic field $B_{net}$ proximate to the RF coil, wherein the net RF magnetic field $B_{net}$ after exciting the sample material with the excitation RF magnetic field $B_1$ is the vector sum of the magnetic field $B_M$ of the rotating magnetization M, where $B_M = \mu_o M$ and $\mu_o$ is the magnetic permeability of free space, and the induced RF magnetic field $B_2$, wherein a first portion of an MRI signal is produced for the region of interest;
adjusting the impedance of the RF coil;
exciting the sample material with the excitation RF magnetic field $B_1$, which has a component perpendicular to the static magnetic field $B_o$, such that the magnetization M of the sample material rotates;
detecting the net RF magnetic field $B_{net}$ in the region of interest after exciting the sample material with the excitation RF magnetic field $B_1$, wherein the net RF magnetic field $B_{net}$ after adjusting the impedance of the RF coil and exciting the sample material with the excitation RF magnetic field $B_1$ is the vector sum of the magnetic field $B_M$ of the rotating magnetization M and the induced RF magnetic field $B_2$, wherein a second portion of an MRI signal is produced for the region of interest; and producing simulated fMRI data for the region of interest from the first portion of the MRI signal and the second portion of the MRI signal.

51. The method according to claim 50, wherein adjusting the impedance of the RF coil comprises adjusting the resistance of the RF coil.

52. The method according to claim 51, wherein the excitation RF magnetic field $B_1$ is perpendicular to the static magnetic field $B_o$.

53. The apparatus according to claim 50, wherein the RF coil is rectangular.

54. The apparatus according to claim 50, wherein exciting the sample material with the excitation RF magnetic field $B_1$ comprises exciting the sample material with the excitation RF magnetic field $B_1$ via an MR scanner and detecting the net RF magnetic field $B_{net}$ comprises detecting the net RF magnetic field $B_{net}$ via the MR scanner to produce simulated fMRI data.

55. The method according to claim 50, wherein the RF coil is sufficiently proximate to the sample material that excitation of the sample material produces a positive enhancement level in at least a portion of the region of interest.

56. The method according to claim 55, where the enhancement level is defined as $$\frac{V_{net} - V_M}{V_M}$$

where $V_{net}$ is the voltage produced in a receive coil during detecting the net RF magnetic field $B_{net}$ when $B_{net}$ is the vector sum of $B_M$ and $B_2$, where $V_M$ is voltage produced in a receive coil during detecting the net RF magnetic field Bnet while the RF coil is decoupled and $B_{net}$ is $B_M$.

57. The method according to claim 50, wherein the RF coil is sufficiently proximate to the sample material that excitation of the sample material produces a negative enhancement level in at least a portion of the region of interest.

58. The method according to claim 57, where the enhancement level is defined as $$\frac{V_{net} - V_M}{V_M}$$

where $V_{net}$ is the voltage produced in a receive coil during detecting the net RF magnetic field $B_{net}$ when $B_{net}$ is the vector sum of $B_M$ and $B_2$, where $V_M$ is voltage produced in a receive coil during detecting the net RF magnetic field Bnet while the RF coil is decoupled and $B_{net}$ is $B_M$.

59. The method according to claim 50, wherein the at least one RF coil is sufficiently proximate to the sample material that excitation of the sample material can produce an enhancement level of at least 0.25% in the region of interest.

60. The method according to claim 50, wherein the impedance of the RF coil is approximately real.

61. The method according to claim 50, further comprising:
locating a second RF coil in the static magnetic field $B_o$, wherein the second RF coil is associated with a second RF magnetic field such that the second RF magnetic field has a component that is perpendicular to the static magnetic field $B_o$, where the second RF coil is proximate the sample material; and adjusting the impedance of the second RF coil during detecting the net RF magnetic field $B_{net}$ in the region of interest after exciting the sample material with the excitation RF magnetic field $B_1$ and while the impedance of the RF coil is adjusted wherein after exciting the sample material with the excitation RF magnetic field $B_1$, the rotation of the magnetization M of the sample material induces a second voltage $V_2$ in the second RF coil, wherein the second voltage induced in the second RF coil produces a second current $I_2$, where $$I_2 = \frac{V_2}{Z_2},$$

where $Z_2$ is the impedance of the second RF coil, wherein the second current produces a second induced RF magnetic field $B_3$, wherein the second induced RF magnetic field $B_3$ alters the net RF magnetic field $B_{net}$ proximate to the second RF coil, wherein the net RF magnetic field $B_{net}$ after exciting the sample material with the excitation RF magnetic field $B_1$ is the vector sum of the magnetic field $B_M$ of the rotating magnetization M, the induced RF magnetic field $B_2$, and the second induced RF magnetic field $B_3$, wherein the second portion of the MRI signal produced for the region of interest includes the effect of the second induced RF magnetic field $B_3$.

62. The method according to claim 61, wherein the RF coil and the second RF coil form a quadrature coil.

63. The method according to claim 62, wherein the second RF coil is orientated at angle with respect to the RF coil with respect to a plane perpendicular to the static magnetic field $B_o$.

64. The method according to claim 63, wherein the second RF coil is orientated at an angle of about 90° with respect to the RF coil with respect to the plane perpendicular to the static magnetic field $B_o$.

65. The method according to claim 63, wherein the RF coil and the second RF coil are both substantially planar, wherein a container having the sample material inside is positioned such that at least a portion of the container is positioned to intersect the plane of the RF coil and to intersect the plane of the second RF coil.

66. The method according to claim 65, wherein the container is positioned within a cylinder formed by the RF coil and the second RF coil.

67. The method according to claim 66 wherein the container is cylindrically shaped.

68. The method according to claim 50, wherein the RF coil has a maximum length in at least one dimension of less than about 4 cm.

69. The method according to claim 50, wherein the RF coil has a maximum length in at least one dimension of less than one-third the maximum length of the sample in the same dimension.

70. The method according to claim 50, wherein the RF coil is located within the sample material.

71. The method according to claim 50, further comprising adjusting the RF coil resistance of the RF coil after exciting the sample material with the excitation RF magnetic field $B_1$ wherein adjusting the RF coil resistance varies the enhancement level after exciting the RF coil sample material with the excitation RF magnetic field $B_1$.

72. The method according to claim 71, wherein the enhancement level is varied between about 1% and about 10%.

73. The method according to claim 71, wherein adjusting the RF coil resistance comprises adjusting the RF coil resistance via software control.

74. The method according to claim 50, wherein the RF coil acts as a local spin magnetization amplifier.

75. The method according to claim 50, further comprising:
at least one additional coil associated with a corresponding at least one additional static magnetic field parallel to the static magnetic field $B_0$, where the at least one additional coil is located such that the corresponding at least one additional static magnetic field associated with the at least one additional coil reaches the region of interest.

76. The method according to claim 75, wherein the at least one additional coil comprises two end coils positioned parallel to each other, wherein at least a portion of the region of interest is between the two end coils.

77. The method according to claim 50, wherein exciting the sample material comprises exciting the sample material with an excitation RF magnetic field $B_1$ that includes a characteristic that models one or more physiological noises.

78. The method according to claim 50, wherein excitation of the sample material produces regions of variable MR image contrast to noise.

79. The method according to claim 50, wherein exciting the sample material comprises controlling the duty cycle of the excitation.

80. The method according to claim 79, wherein controlling the duty cycle of the excitation allows variable and fixed on periods and variable and fixed off periods.

81. The method according to claim 50, wherein exciting the sample material comprises exciting the sample material with an excitation RF magnetic field $B_1$ that includes a characteristic that models a hemo-dynamic response.

82. The method according to claim 81, wherein the hemo-dynamic response is given by $y(t)=\gamma x(t) \cdot h(t)+n(t)$ wherein "·" denoted convolution, $\gamma$ denotes the gain of the fMRI imaging process, and n(t) represents the noise.

83. The method according to claim 82, wherein h(t) is modeled as a Poisson function, where $$h(t) = \frac{\lambda^t e^{-\lambda}}{t!},$$

and $\lambda$ represents the log and dispersion.

84. The method according to claim 82, wherein h(t) is modeled as a Gaussian function, where $$h(t) = \frac{1}{\sqrt{2\pi\sigma^2}} \exp\left(-\frac{(t-\mu)^2}{\sigma^2}\right)$$

and m and s are the mean and standard deviation.

85. The method according to claim 82, wherein h(t) is modeled as a Gamma function, where $$h(t) = \frac{(t/\tau)^{n-1} e^{-t/\tau}}{\tau(n-1)!},$$

and t is time, t is a time constant, and n is a phase delay.

86. The method according to claim 50, wherein exciting the sample material comprises exciting the sample material with an excitation RF magnetic field $B_1$ that includes a characteristic that models smoothing.

87. The method according to claim 50, wherein exciting the sample material comprises exciting the sample material with an excitation RF magnetic field $B_1$ that includes a characteristic that models delay.

88. The method according to claim 50, further comprising at least one additional RF coil.

89. The method according to claim 88, wherein the sample material models a human head, wherein one of the RF coil and the at least one additional RF coil is located at a position in the sample material that approximates the location of the primary visual cortex.

90. The method according to claim 88, wherein the sample material models a human head, wherein one of the RF coil and the at least one additional RF coil is located at a position in the sample material that approximates the location of the primary motor cortex.

91. The method according to claim 88, wherein the sample material models a human head, wherein one of the RF coil and the at least one additional RF coil is located at a position in the sample material that approximates the location of the primary auditory cortex.

92. The method according to claim 50, wherein at least a portion of the sample material moves during detecting the net RF magnetic field $B_{net}$ in the region of interest.

93. The method according to claim 50, wherein the at least a portion of the sample material flows during detecting the net RF magnetic field $B_{net}$ in the region of interest.

94. The method according to claim 50, wherein at least one property of the sample material is adjusted during detecting the net RF magnetic field $B_{net}$ in the region of interest.

95. The method according to claim 50, wherein the RF coil is moved during detecting the net RF magnetic field $B_{net}$ in the region of interest.

* * * * *

UNITED STATES PATENT AND TRADEMARK OFFICE
CERTIFICATE OF CORRECTION

PATENT NO. : 7,215,122 B2
APPLICATION NO. : 10/957822
DATED : May 8, 2007
INVENTOR(S) : Qun Zhao et al.

Page 1 of 2

It is certified that error appears in the above-identified patent and that said Letters Patent is hereby corrected as shown below:

Title Page, Item (57), Abstract,
Line 2, "stimulated MRI data" should read --simulated MRI data--.

Column 3,
Line 22, "Staatistical procedure" should read --Statistical procedure--.

Column 4,
Lines 4-5, "Zhao, *et al.* 2002 Zhao, Q.," should read --Zhao *et al.* 2002; Zhao, Q.,--.
Line 6, "functional Magnetic" should read --Functional Magnetic--.

Column 5,
Line 25, "from a MI system" should read --from an MRI system--.

Column 7,
Line 34, "static filed $B_o$" should read --static field $B_o$--.
Line 35, "region of interest More" should read --region of interest. More--.

Column 9,
Line 10, "normal parallel to $B_o$" should read --normal perpendicular to $B_o$--.
Line 28, "relaxation of by the sample material" should read
    --relaxation of the sample material--.
Line 66, "expanded and contacted" should read --expanded and contracted--.
Line 67, "stimulated fMRI data" should read --simulated fMRI data--.

Column 10,
Line 9, "stimulated fMRI data" should read --simulated fMRI data--.

Column 11,
Line 49, "levels can between about" should read --levels between about--.
Line 60, "with thee functional scan" should read --with the functional scan--.

Column 12,
Line 24, "that utilized" should read --that utilize--.

Column 18,
Line 27, "23 815-50, 1996)" should read --23: pp. 815-50, 1996)--.

UNITED STATES PATENT AND TRADEMARK OFFICE
CERTIFICATE OF CORRECTION

PATENT NO. : 7,215,122 B2
APPLICATION NO. : 10/957822
DATED : May 8, 2007
INVENTOR(S) : Qun Zhao et al.

It is certified that error appears in the above-identified patent and that said Letters Patent is hereby corrected as shown below:

Column 22,
Line 37 claim 12, "sample material produce" should read --sample material produces--.

Column 23,
Line 40 claim 24, "alter exciting" should read --after exciting--.

Column 24,
Line 32 claim 38, "denoted convolution" should read --denotes convolution--.

Column 27,
Line 31 claim 63, "at angle with respect to" should read --at an angle with respect to--.

Column 30,
Line 8 claim 75, "The method according to claim 50" should read --The method according to claim 92--.

Signed and Sealed this

Twenty-fourth Day of June, 2008

JON W. DUDAS
*Director of the United States Patent and Trademark Office*